(12) United States Patent
Vorbach

(10) Patent No.: US 10,031,888 B2
(45) Date of Patent: Jul. 24, 2018

(54) PARALLEL MEMORY SYSTEMS

(75) Inventor: Martin Vorbach, Lingenfeld (DE)

(73) Assignee: Hyperion Core, Inc., Los Gatos, CA (US)

( * ) Notice: Subject to any disclaimer, the term of this patent is extended or adjusted under 35 U.S.C. 154(b) by 423 days.

(21) Appl. No.: 14/000,155

(22) PCT Filed: Feb. 17, 2012

(86) PCT No.: PCT/EP2012/000713
§ 371 (c)(1),
(2), (4) Date: Nov. 7, 2013

(87) PCT Pub. No.: WO2012/123061
PCT Pub. Date: Sep. 20, 2012

(65) Prior Publication Data
US 2014/0052961 A1    Feb. 20, 2014

(30) Foreign Application Priority Data

Feb. 17, 2011  (EP) .................................. 11001304
Feb. 17, 2011  (EP) .................................. 11001305

(Continued)

(51) Int. Cl.
*G06F 15/78*   (2006.01)
*G06F 9/30*    (2018.01)
(Continued)

(52) U.S. Cl.
CPC ........ *G06F 15/7839* (2013.01); *G06F 9/3017* (2013.01); *G06F 9/30043* (2013.01);
(Continued)

(58) Field of Classification Search
CPC ... G06F 15/16; G06F 15/7821; G06F 15/7839
See application file for complete search history.

(56) References Cited

U.S. PATENT DOCUMENTS 6,948,050 B1 *  9/2005  Gove .................... G06F 9/3851
                                                         712/35
7,237,071 B2 *  6/2007  Jahnke ................ G06F 12/0831
                                                         710/113

(Continued)

FOREIGN PATENT DOCUMENTS

WO    2010/142432    2/2010
WO    2010/043401    4/2010

(Continued)

OTHER PUBLICATIONS

Rambus XDR Architecture; DL-0161 Advance Information, Version 0.8, 2002-2003, 34 pages.

(Continued)

*Primary Examiner* — Ryan Bertram
(74) *Attorney, Agent, or Firm* — IP Spring

(57) ABSTRACT

The invention relates to a multi-core processor memory system, wherein it is provided that the system comprises memory channels between the multi-core processor and the system memory, and that the system comprises at least as many memory channels as processor cores, each memory channel being dedicated to a processor core, and that the memory system relates at run-time dynamically memory blocks dedicatedly to the accessing core, the accessing core having dedicated access to the memory bank via the memory channel.

19 Claims, 16 Drawing Sheets

(30) Foreign Application Priority Data

| | | |
|---|---|---|
| May 16, 2011 | (EP) | 11004033 |
| Jun. 8, 2011 | (EP) | 11004667 |
| Jun. 27, 2011 | (EP) | 11005196 |
| Jul. 8, 2011 | (WO) | PCT/EP2011/003428 |
| Aug. 16, 2011 | (EP) | 11006698 |
| Sep. 9, 2011 | (EP) | 11007370 |
| Dec. 16, 2011 | (EP) | 11009911 |
| Dec. 16, 2011 | (EP) | 11009912 |
| Dec. 16, 2011 | (EP) | 11009913 |

(51) Int. Cl.
G06F 9/345 (2018.01)
G06F 9/38 (2018.01)
G06F 8/41 (2018.01)
G11C 8/16 (2006.01)
G11C 11/412 (2006.01)

(52) U.S. Cl.
CPC .............. *G06F 9/345* (2013.01); *G06F 9/38* (2013.01); *G06F 15/7821* (2013.01); *G06F 8/4441* (2013.01); *G06F 8/452* (2013.01); *G06F 2213/0038* (2013.01); *G11C 8/16* (2013.01); *G11C 11/412* (2013.01); *Y02D 10/12* (2018.01); *Y02D 10/13* (2018.01)

(56) References Cited

U.S. PATENT DOCUMENTS

| | | | | |
|---|---|---|---|---|
| 7,627,723 | B1* | 12/2009 | Buck | G06F 9/3001 711/155 |
| 2002/0046324 | A1* | 4/2002 | Barroso | G06F 12/0826 711/122 |
| 2002/0056030 | A1* | 5/2002 | Kelly | G06F 9/3802 711/150 |
| 2006/0031721 | A1* | 2/2006 | Blanchard | G06F 11/3024 714/47.2 |
| 2006/0070054 | A1* | 3/2006 | Naik | G06F 8/67 717/165 |
| 2006/0117155 | A1 | 6/2006 | Ware et al. | |
| 2006/0179196 | A1* | 8/2006 | Gray | G06F 13/14 710/240 |
| 2007/0091104 | A1* | 4/2007 | Singh | G06F 13/1663 345/531 |
| 2010/0115170 | A1* | 5/2010 | Jeong | G06F 15/163 710/308 |
| 2011/0055452 | A1* | 3/2011 | Suzuki | G06F 13/4022 710/317 |
| 2011/0119467 | A1* | 5/2011 | Cadambi | G06F 15/7821 712/27 |
| 2011/0208997 | A1* | 8/2011 | Czajkowski | G06F 11/1497 714/10 |
| 2011/0225334 | A1* | 9/2011 | Byrne | G06F 13/4027 710/110 |
| 2013/0103923 | A1* | 4/2013 | Pan | G06F 12/1027 711/207 |

FOREIGN PATENT DOCUMENTS

| | | |
|---|---|---|
| WO | 2011/079942 | 7/2011 |
| WO | 2012/003997 | 1/2012 |

OTHER PUBLICATIONS

European Patent Office, International Search Report for International Patent Application No. PCT/EP2012/000713, dated Sep. 6, 2012, 5 pages.

European Patent Office, Written Opinion for International Patent Application No. PCT/EP2012/000713, dated Sep. 6, 2012, 8 pages.

Arm Ltd., ARM926EJ-S™Revision: r0p5 Technical Reference Manual; DI0198E_arm926ejs_r0p5_trm.pdf, 2001-2008, 236 pages.

Dilillo, Luigi et al., "Minimizing Test power in SRAM through Reduction of Precharge", Design, Automation and Test in Europe, 2006. DATE'06. Proceedings. vol. 1. IEEE, 2006, 6 pages.

Micron Technology, Inc., "Technical Note FBDIMM—Channel Utilization (Bandwidth)", PDF: 09005aef8251c075, tn4721.fm—Rev. B Jan. 2010 EN, 23 pages.

Shanley, "Pentium Pro and Pentium II System Architecture", Second Edition, Mindshare Inc.; ISBN978-0-201-30973-7, 1998, 619 pages.

Shanley, "The Unabridged Pentium 4", IA32 Processor Genealogy; Mindshare Inc.; ISBN0-321-25656-X, 2004, 394 pages.

"VideoLAN," http://www.videolan.org/developers/x264.html: VLC media player and x264 are trademarks registered (or in registration process) by the VideoLAN non-profit organization. Software are licensed under the GNU General License., 3 pages.

Wechsler, Ofri, "Inside Intel® Core™ Microarchitecture: Setting New Standards for Energy-Efficient Performance", White Paper; Copyright © 2006; Intel Corporation; Printed in the United States. 0306/RMR/HBD/2K311830-00IUS, 2006, 12 pages.

Weste, Neil H. E. et al., "A circuits and systems perspective", CMOS VLSI Design; Fourth Edition; Addison-Wesley; ISBN-13:978-0-321-54774-3, 2011, 867 pages.

\* cited by examiner

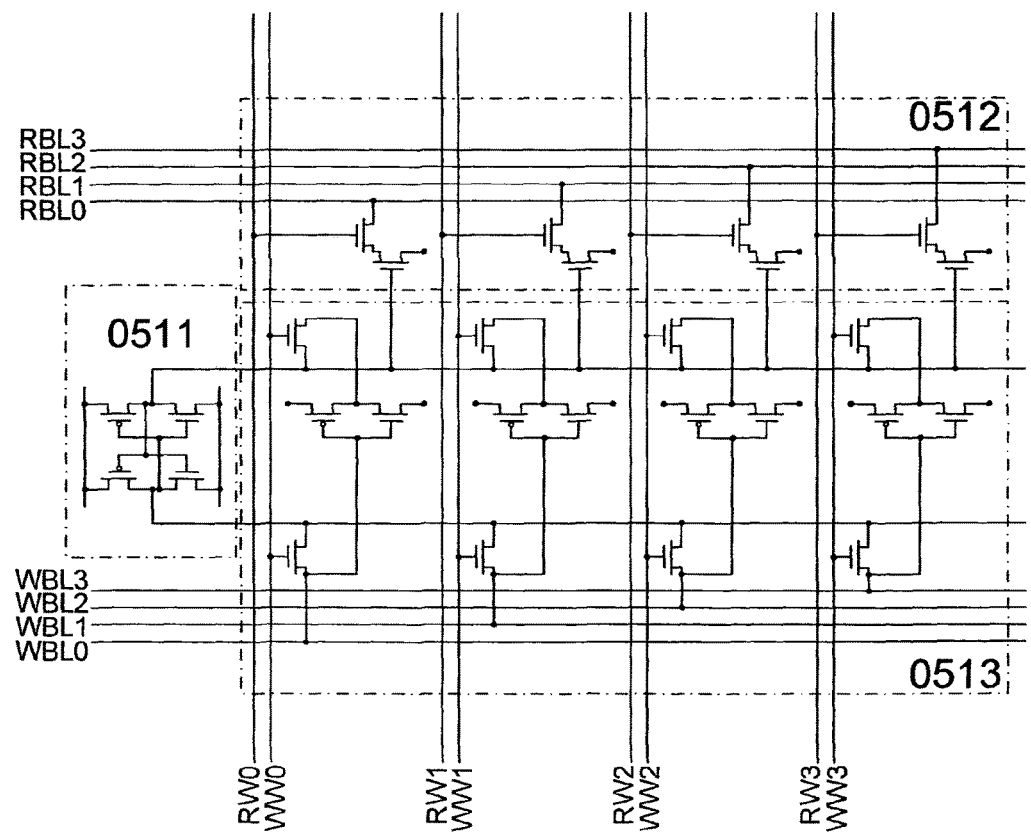

Fig. 10a

```
imul    ebx, DWORD PTR [edx+12+eax*4], 42659
imul    esi, DWORD PTR [edx+8+eax*4], 8407
add     esi, ebx
imul    ebx, DWORD PTR [edx+4+eax*4], 7031
add     esi, ebx
imul    ebx, DWORD PTR [edx+eax*4], 3323
add     esi, ebx
imul    ebx, DWORD PTR [edx+ecx*4], 30124
lea     ebx, [esi+ebx]
mov     DWORD PTR [edi+ecx*4], ebx
```

Fig. 10b

```
<<ldr>>     vr0, base=edx, ofs=eax*4+12
<<imul>>    ebx, vr0, 42659
<<ldr>>     vr1, base=edx, ofs=eax*4+8
<<imul>>    esi, vr1, 8407
<<add>>     esi, ebx
<<ldr>>     vr2, base=edx, ofs=eax*4+4
<<imul>>    ebx, vr2, 7031
<<add>>     esi, ebx
<<ldr>>     vr3, base=edx, ofs=eax*4
<<imul>>    ebx, vr3, 3323
<<add>>     esi, ebx
<<ldr>>     vr4, base=edx, ofs=ecx*4
<<imul>>    ebx, vr4, 30124
<<lea>>     ebx, [esi+ebx]
<<str>>     base=edi, ofs=ecx*4, ebx
```

Fig. 10c

```
<<ldr>>     vr0, base=edx, ofs=eax*4+12
<<ldr>>     vr1, base=edx, ofs=eax*4+8
<<ldr>>     vr2, base=edx, ofs=eax*4+4
<<ldr>>     vr3, base=edx, ofs=eax*4
<<ldr>>     vr4, base=edx, ofs=ecx*4
<<imul>>    ebx, vr0, 42659
<<imul>>    esi, vr1, 8407
<<add>>     esi, ebx
<<imul>>    ebx, vr2, 7031
<<add>>     esi, ebx
<<imul>>    ebx, vr3, 3323
<<add>>     esi, ebx
<<imul>>    ebx, vr4, 30124
<<lea>>     ebx, [esi+ebx]
<<str>>     base=edi, ofs=ecx*4, ebx
```

Fig. 10d

```
<<ldrm4>>   [vr0, vr1, vr2, vr3], base=edx,
            ofs=[eax*4+12, eax*4+8, eax*4+4, eax*4]
<<ldr>>     vr4, base=edx, ofs=ecx*4
<<imul>>    ebx, vr0, 42659
<<imul>>    esi, vr1, 8407
<<add>>     esi, ebx
<<imul>>    ebx, vr2, 7031
<<add>>     esi, ebx
<<imul>>    ebx, vr3, 3323
<<add>>     esi, ebx
<<imul>>    ebx, vr4, 30124
<<lea>>     ebx, [esi+ebx]
<<str>>     base=edi, ofs=ecx*4, ebx
```

1001

```
<<ldrm5>>   [vr0, vr1, vr2, vr3, vr4], base=edx,
            ofs=[eax*4+12, eax*4+8, eax*4+4, eax*4, ecx*4]
```

Fig. 10

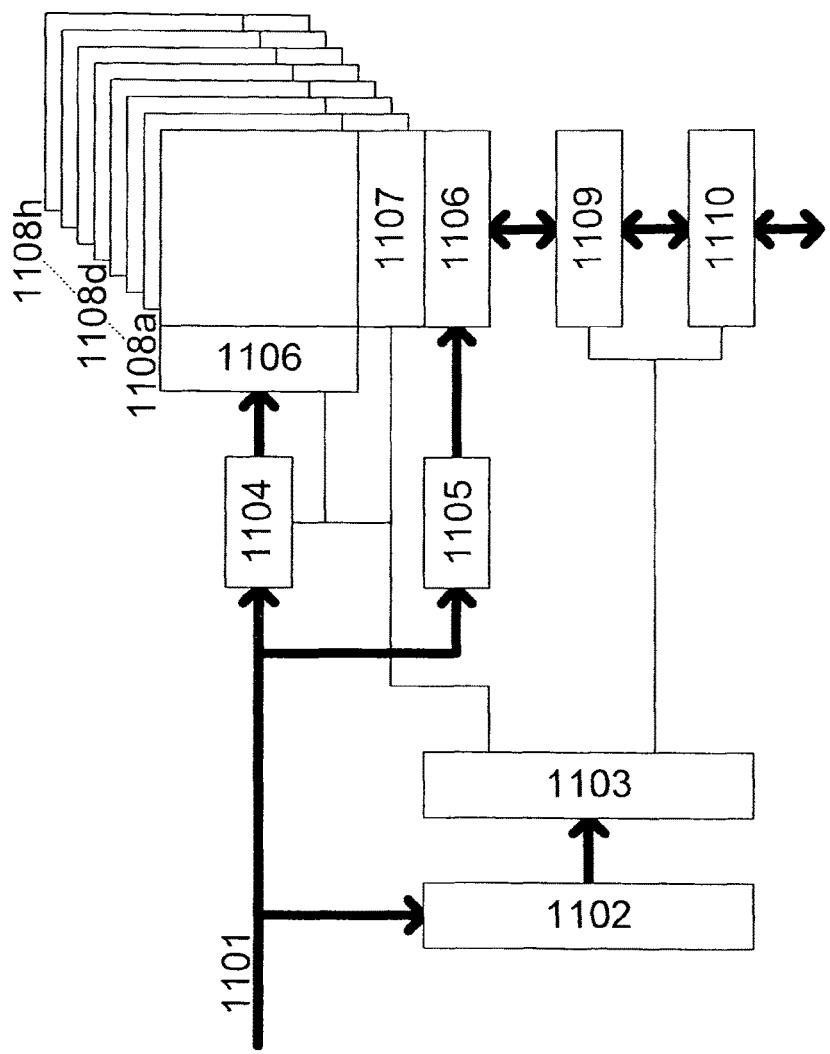
Fig. 11 - Prior Art

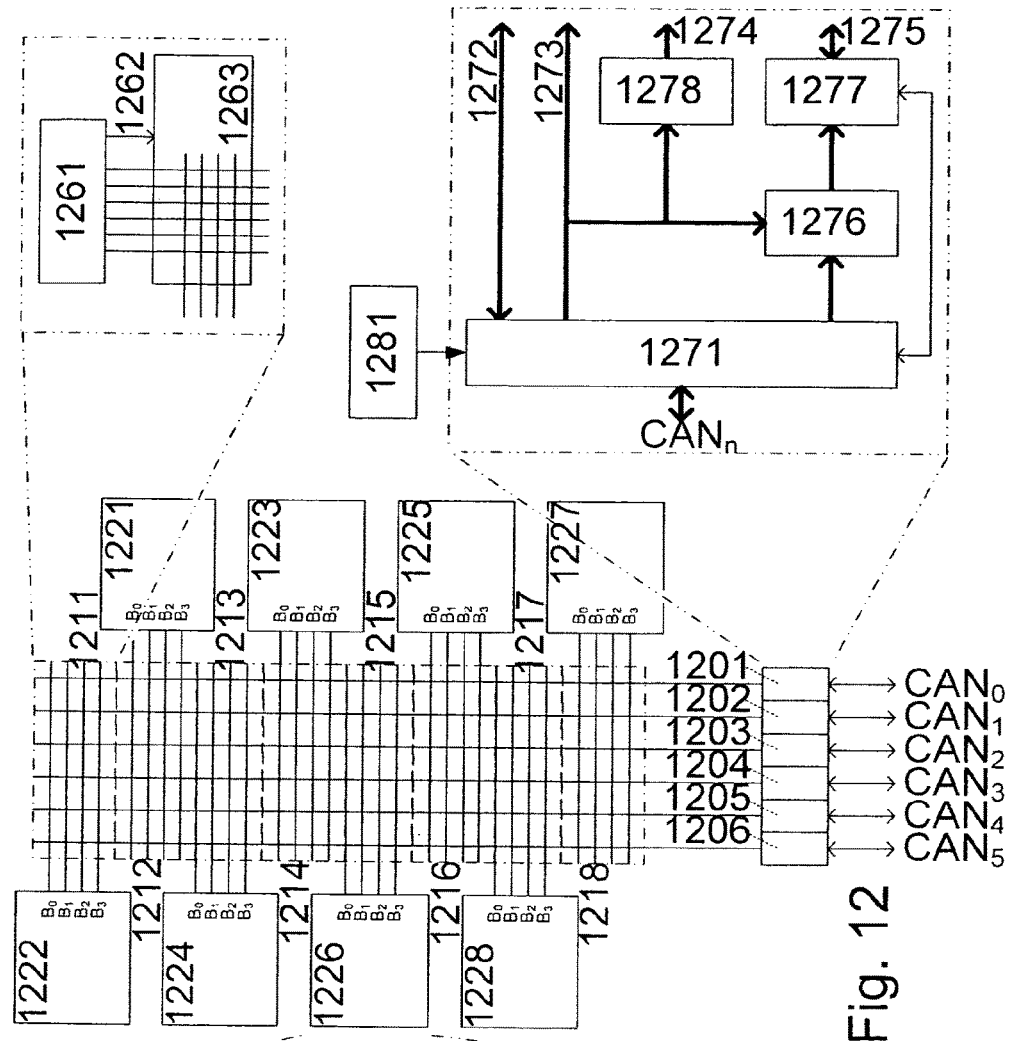
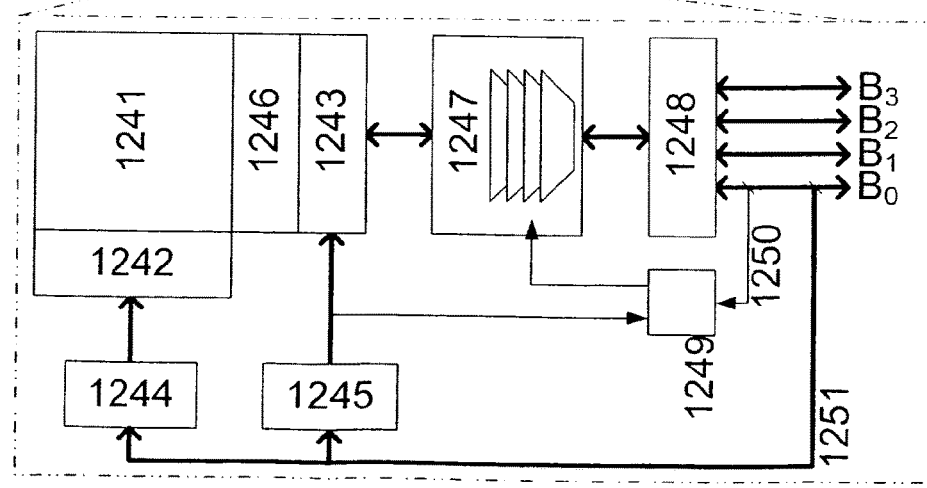
Fig. 12

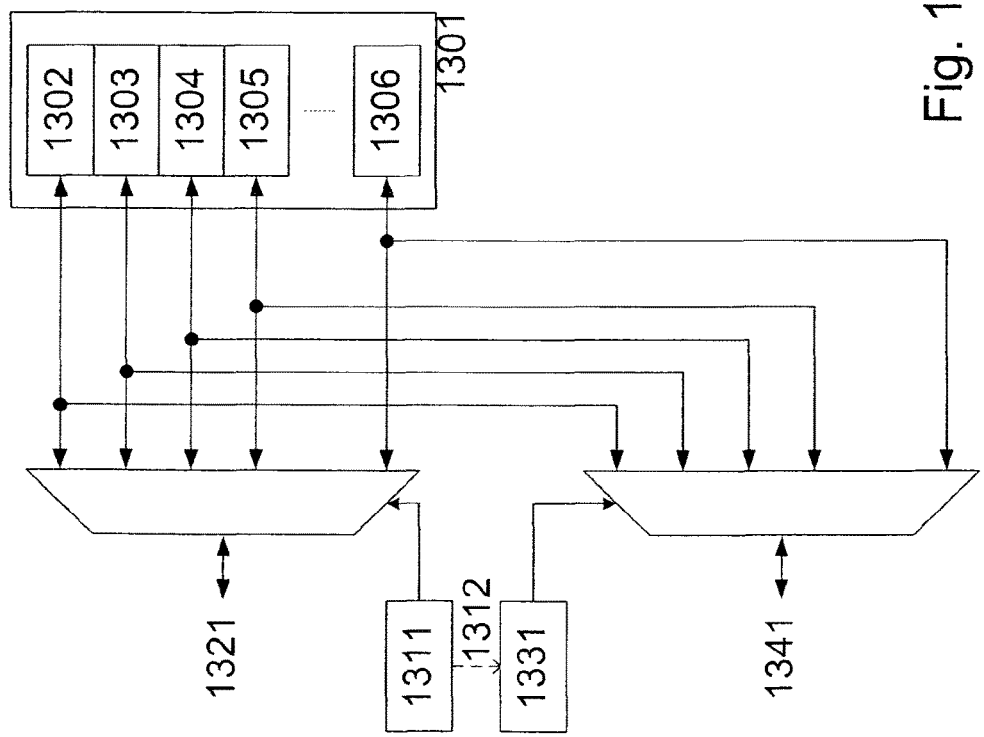

PARALLEL MEMORY SYSTEMS

INTRODUCTION AND FIELD OF INVENTION

The present invention relates to data processing in general and to data processing architecture in particular.

Energy efficient, high speed data processing is desirable for any processing device. This holds for all devices wherein data are processed such as cell phones, cameras, hand held computers, laptops, workstations, servers and so forth offering different processing performance based on accordingly adapted architectures.

Often similar applications need to be executed on different devices and/or processor platforms. Since coding software is expensive, it is be desirable to have software code which can be compiled without major changes for a large number of different platforms offering different processing performance.

It would be desirable to provide a data processing architecture that can be easily adapted to different processing performance requirements while necessitating only minor adoptions to coded software

BRIEF DESCRIPTION OF DRAWINGS

FIG. 5a is a diagrammatic illustration of an example multiport SRAM cell;

FIG. 10, including FIGS. 10a, 10b, 10c, and 10d, is a diagrammatic illustration of an example implementation of microcode splitting and fusion on complex instruction set computer (CISC) instructions;

FIG. 11 is a diagrammatic illustration of an example dynamic random access memory (DRAM) of the prior art;

FIG. 12 is a diagrammatic illustration of an example memory chip according to the present disclosure; and FIG. 13 is a diagrammatic illustration of an example memory configuration.

DETAILED DESCRIPTION

Figure 2:
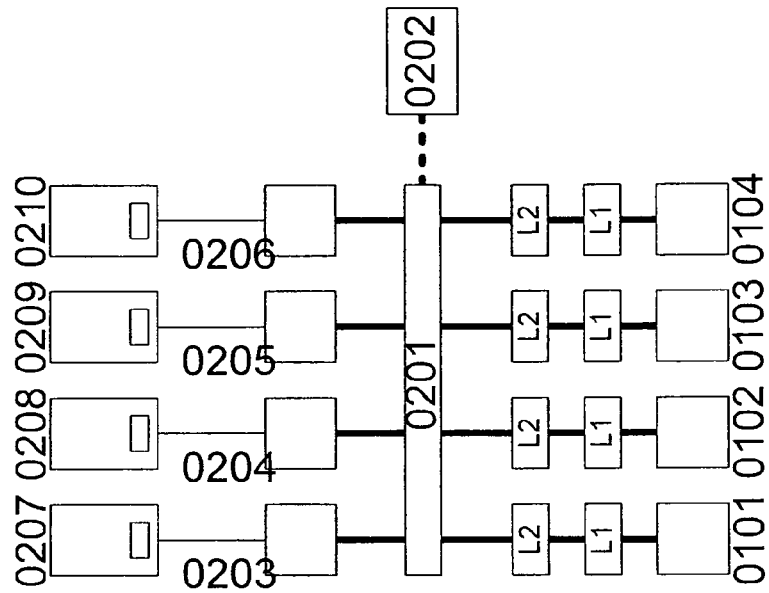
FIG. 2 is a diagrammatic illustration of an example multi-core processor memory architecture of the present disclosure.

It is an object of the present invention to provide an improvement over the prior art of processing architectures with respect to at least one of data processing efficiency, power consumption and reuse of the software codes.

The present invention describes a new processor architecture called ZZYX thereafter, overcoming the limitations of both, sequential processors and dataflow architectures, such as reconfigurable computing.

It shall be noted that whereas hereinafter, frequently terms such as "each" or "every" and the like are used when certain preferred properties of elements of the architecture and so forth are described. This is done so in view of the fact that generally, it will be highly preferred to have certain advantageous properties for each and every element of a group of similar elements. It will be obvious to the average skilled person however, that some if not all of the advantages of the present invention disclosed hereinafter might be obtainable, even if only to a lesser degree, if only some but not all similar elements of a group do have a particular property. Thus, the use of certain words such as "each", "any" "every" and so forth. is intended to disclose the preferred mode of invention and whereas it is considered feasible to limit any claim to only such preferred embodiments, it will be obvious that such limitations are not meant to restrict the scope of the disclosure to only the embodiments preferred.

Any kind of multi-processor architecture, be it for example a multi-core single chip processor or a parallel processor system, is addressed by the term "multi-core" or "multi-core processor", a single processor core may be addressed by the term "core" or "processor-core".

It shall also be noted that notwithstanding the fact that a completely new architecture is disclosed hereinafter, several aspects of the disclosure are considered inventive per se, even in cases where other advantageous aspects described hereinafter are not realized.

The technology described in this patent is particularly applicable on

- ZYXX processors as described in PCT/EP 2009/007415;
- their memory architectures as described in PCT/EP 2010/003459, which are also applicable on multi-core processors are known in the state of the art (e.g. from Intel, AMD, MIPS and ARM); and
- exemplary methods for operating ZYXX processors and the like as described in ZZYX09 (EP 10 013 932.8), PCT/EP 2010/07950.
- exemplary implementations of ZYXX processors and the like as described in ZZYX10 (EP 11 000 597.2), PCT/EP 2011/003428.

The patents listed above are incorporated by reference into this specification for detailed disclosure.

Furthermore, the following documents are incorporated herewith in their entirety by reference; where applicable, their priorities are also claimed herewith, it being noted that all of these documents have been filed with the EPO (accordingly this being the regional office the earlier applications having been filed, thus the filing having been effected inter alia with respect to Germany): - filed 17 Feb. 2011: EP 11 001 304.2; -/- filed 16 Aug. 2011: EP 11 006 698.2; -/- filed 16 Dec. 2011: EP 11 009 913.2; -/- filed 15 Oct. 2008: EP 08 018 039.1; -/- filed 15 Oct. 2009: PCT/EP 2009/007416; -/- filed 4 Nov. 2008: EP 08 019 266.9; -/- filed 19 Nov. 2008: EP 08 020 167.6; -/- filed 15 Jan. 2009:

EP 09 000 492.0; -/- filed 16 Mar. 2009: EP 09 003 744.1; -/- filed 7 Jul. 2009: EP 09 008 859.2; -/- filed 9 Jun. 2009: EP 09 007 607.6; -/- filed 15 Jun. 2009: EP 09 007 815.5; -/- filed 7 Jul. 2009: EP 09 008 861.8; -/- filed 20 Jan. 2010: EP 10 000 530.5; -/- filed 25 Jan. 2010: EP 10 000 689.9; -/- filed 29 Jan. 2010: EP 10 000 920.8; -/- filed 12 Feb. 2010: EP 10 001 453.9; -/- filed 12 Feb. 2010: EP 10 001 454.7; -/- filed 2 Mar. 2010: EP 10 002 122.9; -/- filed 15 Oct. 2009: PCT/EP 2009/007415; -/- filed 9 Jun. 2010: PCT/EP 2010/003459; -/- filed 3 May 2010: EP 10 004 645.7; -/- filed 28 Dec. 2009: EP 09 016 045.8; -/- filed 28 Dec. 2010: PCT/EP 2010/007950; -/- filed 15 Jan. 2010: EP 10 000 349.0; -/- filed 2 Mar. 2010: EP 10 002 086.6; -/- filed 9 Jul. 2010: EP 10 007 074.7; -/- filed 19 Jul. 2010: EP 10 007 437.6; -/- filed 23 Jul. 2010: EP 10 007 657.9; -/- filed 21 Aug. 2010: EP 10 008 734.5; -/- filed 27 Sep. 2010: EP 10 010 803.4; -/- filed 4 Oct. 2010: EP 10 013 253.9; -/- filed 25 Oct. 2010: EP 10 013 932.8; -/- filed 28 Dec. 2010: EP 10 016 117.3; -/- filed 26 Jan. 2011: EP 11 000 597.2; -/- filed 8 Jul. 2011: PCT/EP 2011/003428; -/- filed 17 Feb. 2011: EP 11 001 305.9; -/- filed 16 May 2011: EP 11 004 033.4; -/- filed 8 Jun. 2011: EP 11 004 667.9; -/- filed 27 Jun. 2011: EP 11 005 196.8; -/- filed 9 Sep. 2011: EP 11 007 370.7; -/- filed 16 Dec. 2011: EP 11 009 912.4; -/- filed 16 Dec. 2011: EP 11 009 911.6.

The ZZYX processor comprises multiple ALU-Blocks in an array with pipeline stages between each row of ALU-Blocks. Each ALU-BLOCK may comprise further internal pipeline stages. In contrast to reconfigurable processors data flows preferably in one direction only, in the following exemplary embodiments from top to bottom. Each ALU may execute a different instruction on a different set of data, whereas the structure may be understood as a MIMD (Multiple Instruction, Multiple Data) machine.

The ZZYX processor is optimized for loop execution. In contrast to traditional processors, instructions once issued to the ALUs may stay the same for a plurality of clock cycles, while multiple data words are streamed through the ALUs. Each of the multiple data words is processed based on the same temporarily fixed instructions. After a plurality of clock cycles, e.g. when the loop has terminated, the operation continues with one or a set of newly fetched, decoded and issued instruction(s).

The ZZYX processor provides sequential VLIW-like processing combined with superior dataflow and data stream processing capabilities. The ZZYX processor cores are scalable in at least 3 ways:
1. The number of ALUs can be scaled at least two dimensionally according to the required processing performance; the term multi-dimensional is to refer to "more than one dimension". It should be noted that stacking several planes will lead to a three dimensional arrangement;
2. the amount of Load/Store units and/or Local Memory Blocks is scalable according to the data bandwidth required by the application;
3. the number of ZZYX cores per chip is scalable at least one dimensionally, preferably two or more dimensionally, according to the product and market. Low cost and low power mobile products (such as mobile phones, PDAs, cameras, camcorders and mobile games) may comprise only one or a very small amount of ZZYX cores, while high end consumer products (such as Home PCs, HD Settop Boxes, Home Servers, and gaming consoles) may have tens of ZZYX cores or more.

High end applications, such as HPC (high performance computing) systems, accelerators, servers, network infrastructure and high and graphics may comprise a very large number of interconnected ZZYX cores.

ZZYX processors may therefore represent one kind of multicore processor and/or chip multiprocessors (CMPs) architecture.

The concepts of the ZZYX processor and the inventions described in this patent are applicable on traditional processors, multithreaded processors and/or multi-core processors. A traditional processor is understood as any kind of processor, which may be a microprocessor, such as an AMD Phenom, Intel Pentium, Core2 or Xeon, IBM's and Sony's CELL processor, ARM, Tensilica or ARC; but also DSPs such as the C64 family from TI, 3DSP, Starcore, or the Blackfin from Analog Devices.

The concepts disclosed are also applicable on reconfigurable processors, such as SiliconHive, IMEC's ADRES, the DRP from NEC, Stretch, or IPFlex; or multi-processors systems such as Picochip or Tilera. Most of the concepts, especially the memory hierarchy, local memories elements, and Instruction Fetch units as well as the basic processor model can be used in FPGAs, either by configuring the according mechanisms into the FPGAs or by implementing according hardwired elements fixedly into the silicon chip. FPGAs are known as Field Programmable Gate Arrays, well known from various suppliers such as XILINX (e.g. the Virtex or Spartan families), Altera, or Lattice.

The concepts disclosed are particularly well applicable on stream processors, graphics processors (GPU) as for example known from NVidia (e.g. GeForce, and especially the CUDA technology), ATI/AMD and Intel (e.g. Larrabee), and especially General Purpose Graphics Processors (GPGPU) also know from NVidia, ATI/AMD and Intel.

ZZYX processors may operate stand alone, or integrated partially, or as a core into traditional processors or FPGAs; it is noted that any such FPGA integrating a ZZYX processor as disclosed hereinafter will be or have coarse granular elements. While ZZYX may operate as a co-processor or thread resource connected to a processor (which may be a microprocessor or DSP), it may be integrated into FPGAs as processing device. FPGAs may integrate just one ZZYX core or multiple ZZYX cores arranged in a horizontal or vertical strip or as a multi-dimensional matrix.

All described embodiments are exemplary and solely for the purpose of outlining the inventive apparatuses and/or methods. Different aspects of the invention can be implemented or combined in various ways and/or within or together with a variety of other apparatuses and/or methods.

A variety of embodiments is disclosed in this patent. However, it shall be noted, that the specific constellation of methods and features depends on the final implementation and the target specification.

Parallel processors and parallel computers are known in the state of the art. One of the major issues of parallel computing is managing the system memory. Several memory architectures have been implemented in the past, for example Unified and Non-Unified Memory Architectures (UMA, NUMA).

Recent multi-core processors use a cache hierarchy combining the memory channel of each of the processors into a single channel ultimately connecting to a monolithic main memory.

The requirements for data transfer rates, memory bandwidth and access time requirements are tightened by a plurality of processors accessing the system memory. This is addressed by wider parallel buses to the memory.

Another concern of this patent is to increase the amount of parallel memory accesses per clock cycle. In modern applications, e.g. such as video encoding and/or decoding, load/store operations accessing the memory hierarchy can amount to 30% or even more of the total number of instructions of an application. In addition to latency the limitation of sequentially accessing the memory hierarchy significantly reduces the processor performance and potentially prohibits other parallel executions.

This invention concerns a novel system memory architecture for multi-core processors and parallel processor systems.

Parallel Access Memory System

In the patents [1] and [2] are memory architectures described, comprising a plurality of parallel accessibly memory systems, each defined by a base address. A plurality of address generators and/or load/store units, each dedicated to a specific base address are capable of accessing the memories in parallel.

However, analysis of software code has shown that often a plurality of addresses defined by a joint base address should be accessed in parallel to increase the processor performance.

Transferring a plurality of data words in a single transfer cycle is beneficial in a number of respects, e.g. reduced power dissipation and quicker availability of operand data. Particularly latencies for loading data can be avoided and/or limited. In the past high level language compilers (e.g. GNU GCC) and/or programmers limited the effects of load latency by placing the load instruction and the instructions requiring the loaded data as operand as far apart as possible and moving unrelated instructions in between. The unrelated instructions required ideally the same or more time for execution than the data to be loaded and available. However with increasing instruction level parallelism (ILP) the execution time for those unrelated instruction becomes significantly reduced, while the load latency remains. Parallel execution units, such as e.g. the ALU-Block of ZZYX processors (reference is made to [1]) and/or VLIW processors, can process many instructions in a single clock cycle, exposing the load latency. For example ZZYX ALU-Blocks can execute in one embodiment 16 instructions per clock cycle, in future embodiments even more; today's VLIW processors execute typically 4 to 8 instructions within a cycle; CISC processors such as Intel's x86 processors (e.g. Pentium, Core1, Sandybridge) provide similar instruction level parallelism.

Vector computers or processors having vector units such as Intel MMX, SEn and/or ARM Neon software can combine a plurality of data packets into a vector. As such a very wide data vector comprising a plurality of data words is simultaneously accessible in the prior art. However, the data vectors have to be predefined and the combination of data words has to be explicitly described and managed in software. It is not possible in the prior art to access random data words simultaneously.

However, often instructions operating on rather unrelated data words could be executed in parallel but no packing into a vector representation is described in the software and/or can be optimized by the compiler. Also often it is not worth to spend the effort packing data words into vectors, as the effort for packing reduces the performance benefits of vector processing.

This deficit is solved by the following invention, in which random words within a vicinity of a base address can be simultaneously accessed in parallel. In one embodiment the words are located above a base, e.g. in a range of 0 . . . 1023 addresses, in another embodiment the vicinity might stretch in the positive and negative direction and may for example range from −511 . . . +511 of the base. Typical ranges (offset sizes added to the base address) are today in the range of $2^6$ to $2^{10}$, but might extend to $2^{16}$ or more in the future.

It is therefore proposed to combine multiple memory accesses based on the same base address and perform them in parallel. Most code will benefit already from two (2) simultaneous accesses per clock cycle, however depending on the implementation even more accesses may be performed in parallel, e.g. 16, 24, . . . . However, in our preferred embodiment four (4) accesses can be performed in parallel.

In one embodiment, load and store accesses can be mixed together, so that one single access comprises both, load and store request. Obviously the simplest implementation can perform one load and one store access in parallel.

Basically the hardware can sort opcodes, e.g. within a TraceCache, Reorder Buffer or Reservation Station and combine (fuse) a plurality of opcodes into a single instruction. Reference is made e.g. to [8] chapter 58. However, in a preferred embodiment the high level language compiler (e.g. C, C++ compiler) and/or the respective tool chain (e.g. assembler) combines the respective memory operations together in one single opcode (if the respective processor implementation provides such a single-cycle multi-data memory access instruction) and/or arranges the sequence of instructions such, that the respective instruction are grouped together in close vicinity, preferably without any other unrelated instructions in between. This optimizes the execution in the processor hardware as either no fusion is necessary (if a respective opcode is provided) or fusion is greatly simplified.

In addition to the processor core, the memory hierarchy has to support the simultaneous plurality of memory accesses. In the prior art, large and power hungry multi-port memories are used. One aspect of this invention is to provide an efficient multi access memory.

Figure 5:
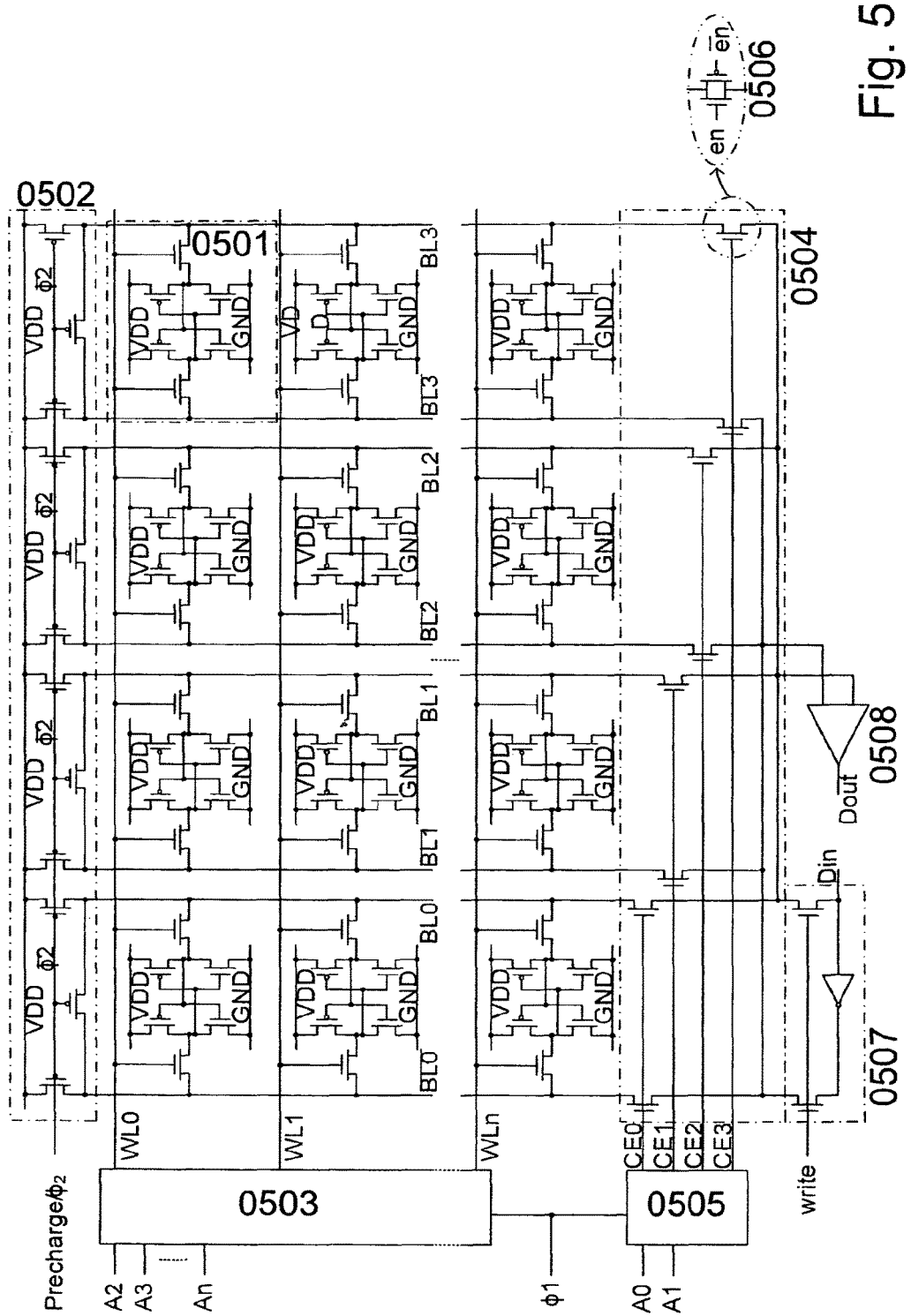
FIG. 5 is a diagrammatic illustration of an example implementation of a static random access memory (SRAM)

FIG. 5 shows an exemplary implementation of a 1-bit SRAM. The exemplary SRAM comprises an array of 4 columns by n rows (the first 2 rows and last row is shown) of SRAM cells (0501). Precharge circuitry (0502) precharges the bitlines ($BL_2$). A row decoder (0503) enables the wordlines ($WL_n$) selecting the row to be accessed, depending on the address of the bit to be accessed ($A_2$ . . . $A_n$).

The respective column is selected via pass transistors (0504), driven by a column decoder (0505) based on addresses $A_1$ and $A_0$. Alternatively, improving signal quality and speed transmission gates (0506) might be implemented instead of pass transistors, increasing transistor count. Another design choice might be the use of multiplexers in place of 0504, reducing transistor count but increasing delay.

A write logic (0507) drives the bitlines for writing data into the selected SRAM cell (0501). Read data is generated using a sense amplifier (0508).

SRAMs are well known and plenty of descriptions and design choices are available in literature. For example reference is made to [9].

FIG. 5a shows an exemplary 4-port SRAM cell of the state of the art as an example of a multiport SRAM cell. The cross coupled inverters (0511) are surrounded by additional read (0512) and write logic (0513) for the 4 ports. Write Bit Line 0 ($WBL_0$) represents the write data bit of port 0, $WBL_1$ for port 1 and so on. Respectively Read Bit Line 0 ($RBL_0$) is the read data bit of port 0, and so on. Each port has its specific Read Word Line ($RW_n$) enable the read drivers and Write Word Line ($WW_n$) for triggering the respective write logic. Multiport SRAMs are well known and plenty of descriptions and design choices are available in literature. For example reference is made to [9].

It becomes immediately obvious, that the port logic requires significantly more resources than the SRAM cell itself, driving area and power consumption. Further, the lack of differential bit lines negatively impacts the noise stability.

Assembly code analysis has shown that in many modern applications a great amount of consecutive memory accesses happen to a close vicinity of a few base addresses, e.g. a stack pointer and/or other pointers to data structures or constants. A great amount of parallelism is exploitable if at least within a range of 256 or 512 words of the base pointer parallel data accesses are possible, preferably independently for each base pointer. Consequently memory accesses based on a specific base pointer are preferably either grouped and/or fused into a block of accesses and/or managed by a dedicated multi-access instruction, so that a plurality of accesses within said exemplary range of 256 or 512 words of the base pointer may be performed in parallel within the same cycle.

It is sufficient to support parallel access within said range by the memory, typically a cache which is usually SRAM based but might in some embodiments also be based on DRAM or other types of memories. This enables the optimization shown in FIG. 6. The exemplary SRAM of FIG. 5 is shown, row 1 is hidden and the precharge circuitry is shown as a box for drawing reasons. The SRAM cells (0501) are in this example identical to those ordinary ones of FIG. 5.

The column circuitry has been duplicated into 2 different and independent column units 0512a and 0512b. The column unit may be designed differently as known in the prior art, e.g. using transmission gates and/or multiplexer structures as discussed in FIG. 5. Each column unit has its independent data in (0507a and 0507b) and data out (0508a and 0508b) interface and column decoder (0505a and 0505b).

The two column units form a two port memory in which two cells of the same row are parallel accessible. This certainly is a limitation compared to the random access multiport memories in the prior art. However, arranging the base address such that one row spans over the address range the limitation becomes minor. Several techniques managing base addresses are subsequently described.

Further column units (0512a, 0512b, . . . , 0512{n}) can be added to form 3-, 4- or any other kind of multiport interface. For example a 4-port memory would comprise 4 column units 0512a, 0512b, 0512c, and 0512d.

In this simple exemplary embodiment, the base address is provided as row address using the address bits $A_2$ to $A_n$. The offset to the base is provided independently for each port via the address bits $P_0A_0$ to $P_0A_1$ for port 0 and $P_1A_0$ to $P_1A_1$ for port 1.

Compared to FIG. 5a the overhead for simultaneously supplying a plurality of data accesses is greatly reduced.

Figure 6:
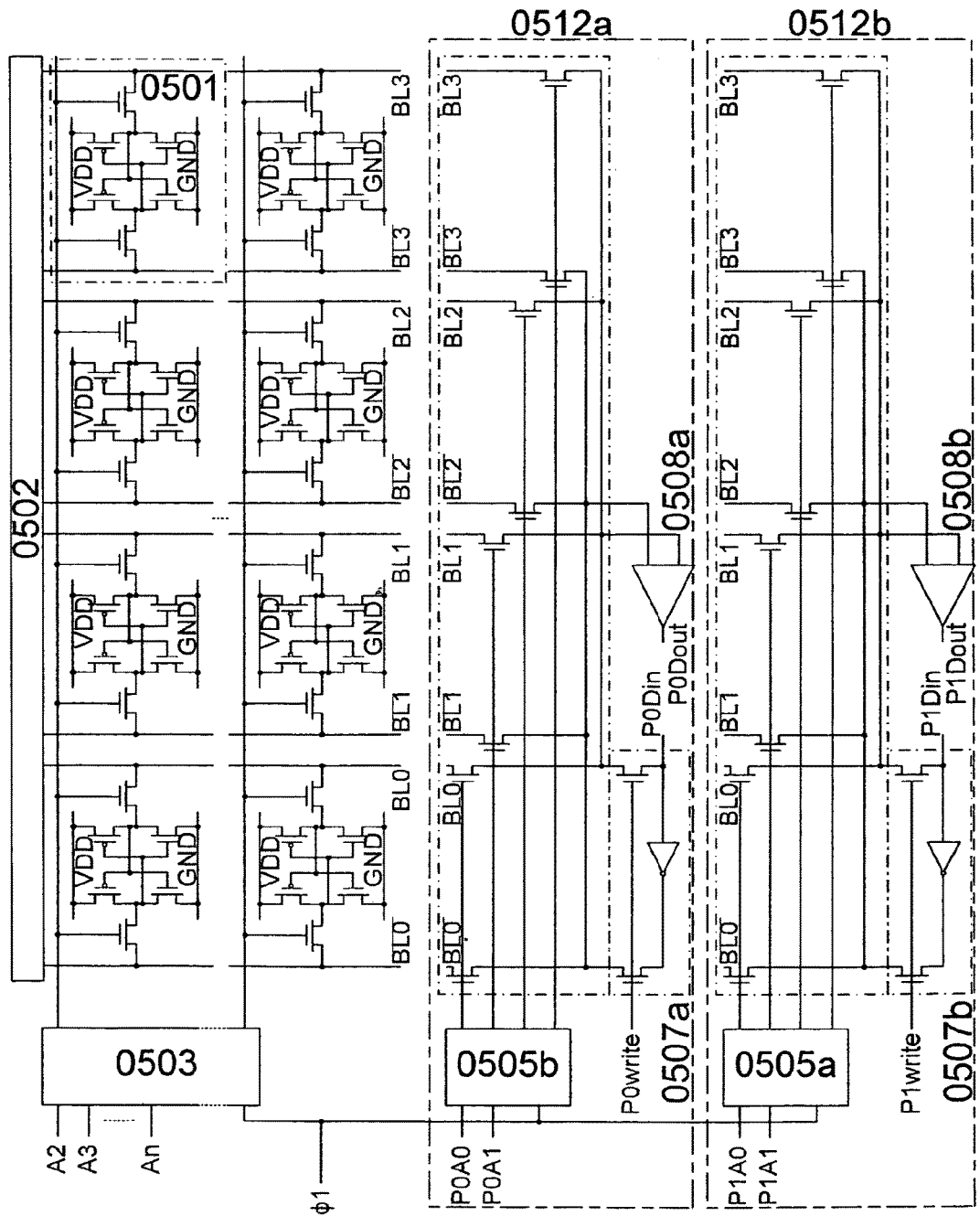
FIG. 6 is a diagrammatic illustration of another example implementation of an SRAM.

The exemplary embodiment of FIG. 6 is limited in that sense, that only data within a single row is parallel accessible. If more data shall be access in parallel, certainly one approach would be making the rows wider by increasing the number of columns. However, in most environments limitations to the aspect ratio and/or the physical shape of an SRAM exist.

Figure 8:
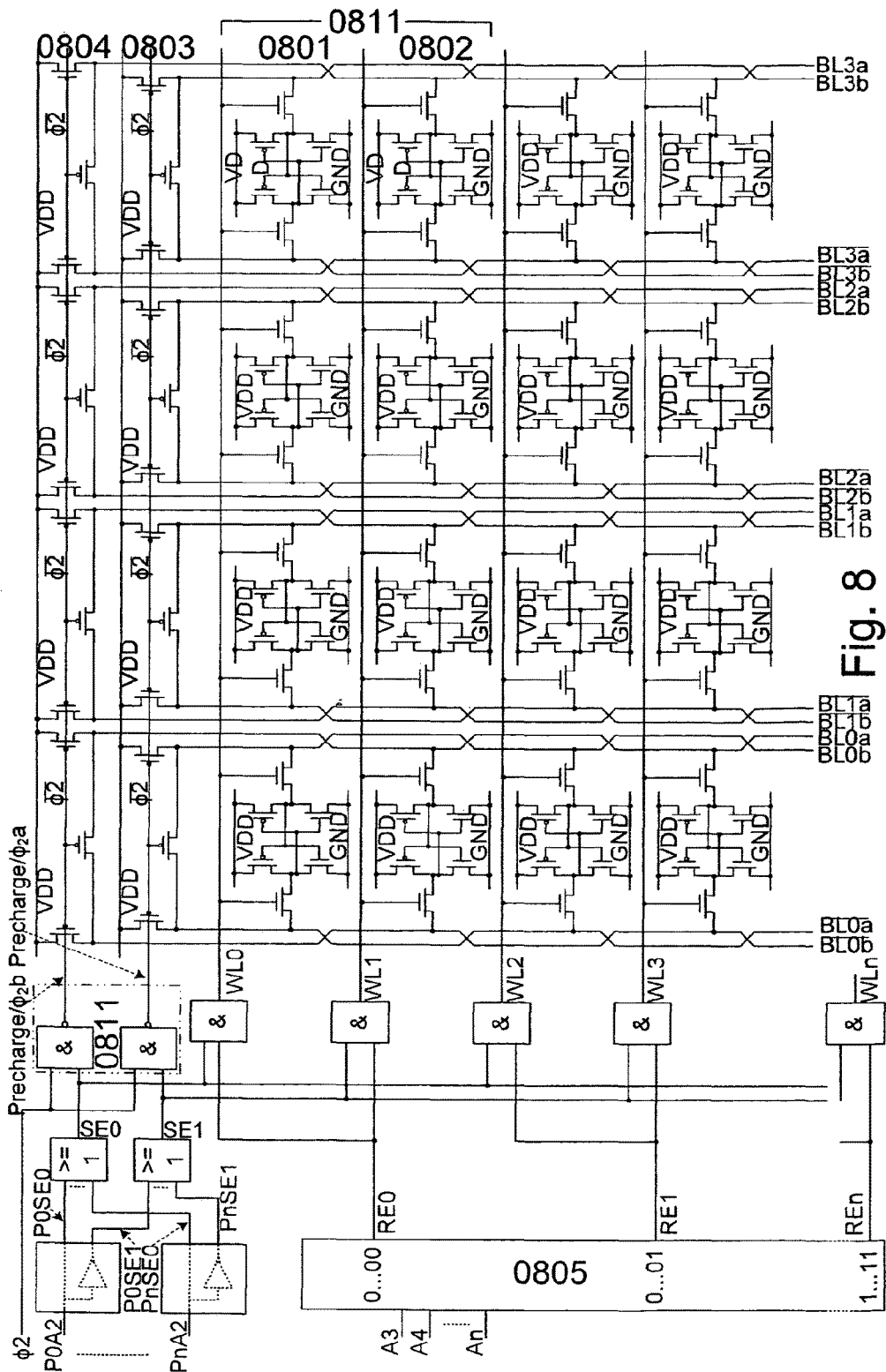
FIG. 8 is a diagrammatic illustration of another example implementation of SRAM.

FIG. 8 shows a modified SRAM core, in which 2 sets or bitlines (i.e. first set: $BL_0a$ and $/BL_0a$, $BL_1a$ and $/BL_1a$, . . . , $BL_na$ and $/BL_na$; second set: $BL_0b$ and $/BL_0b$, $BL_1b$ and $/BL_1b$, . . . , $BL_nb$ and $/BL_nb$) are implements, of which one is used in each alternating row. This allows for simultaneously accessing a group of rows so that data can be read from and/or written independently to a plurality of cells within a plurality of rows (two (2) rows in the exemplary embodiment of FIG. 8). Other embodiments may have more sets of bitlines, e.g. 4 (or 8, or 16) which would allow independent and simultaneous access to 4 (or 8, or 16) rows of the SRAM. Independent access means that data can be independently be read from or written to different cells in the same column. In traditional SRAMs only having one set of bitlines (e.g. $BL_0$ and $/BL_0$) the accesses would conflict as the same bitlines are used by all the addressed cells.

Figure 8A:
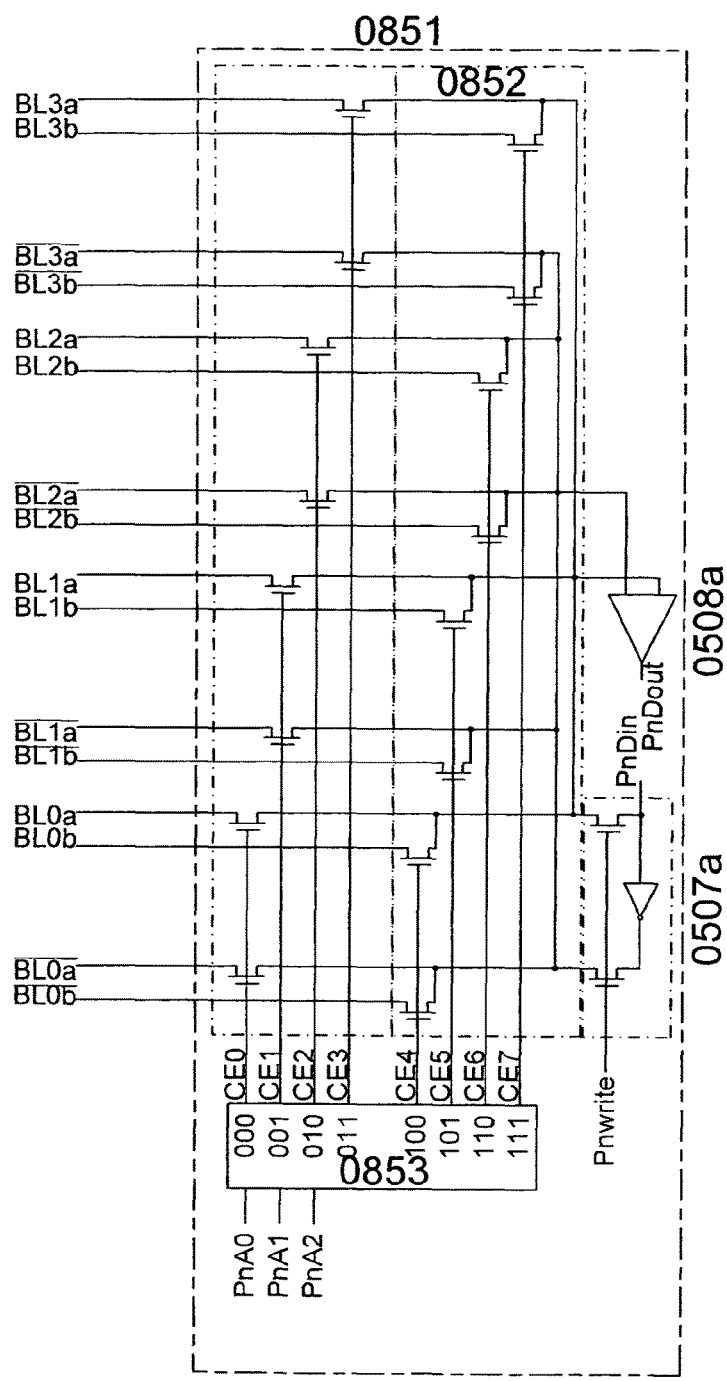
FIG. 8a is a diagrammatic illustration of an example implementation of a structure connecting bitlines to read and/or write logic.

As shown in FIG. 8a it is required to extend the column units (0851) such that the additional bitlines are correctly multiplexed to the read and/or write logic. This can be done by a respectively larger pass transistor, transmission gate, or multiplexer structure (0851) connecting the bitlines to the read (0508a) and/or write logic (0507a). In this exemplary embodiment a second set of pass transistors (0852) is used to connect the additional bitlines with the read and/or write logic. Respectively the column decoder (0853) is enhanced to decode additional address bits: 1 additional address bit in the exemplary embodiment for supporting a total of 2 sets of bitlines; 2 additional bit lines for supporting a total of 4 sets of bitlines; 3 additional bit lines for supporting a total of 8 sets of bitlines; and so forth.

Referring back to FIG. 8 again, the effect of the additional bitlines is the same as having longer rows; only the rows are cut in the middle and physically 2-dimensionally folded. Thus rows are cut into parts (subrows) of equal length, which are stacked on top of each other. Assuming the original row would be 1024 columns wide, it is in the exemplary embodiment of FIG. 8 cut into 2 subrows (e.g. 0801 and 0802) each being 512 columns wide. Bitline pair $BL_{512}a$ and $/BL_{512}a$ of the original 1024 columns wide roe becomes the bitline pair $BL_0b$ and $/BL_0b$ of the second subrow (0802). Respectively the stretched out bit conditioning logic of the 1024 columns wide row is in this exemplary embodiment cut in half, folded and stacked (0803 and 0804).

Other implementations than this exemplary one may fold rows more than one time, so that instead of 2 4, 8 or more subrows are implemented. Consequently the number of bitline pairs ($BL_n/BL_n$) increases from two (in the given example) to 4, 8 or more. Also the wordline conditioning (precharge) and the structure of the column logic according to FIG. 8a is amended respectively.

The row decode is enhance such, that it addresses correctly the folded rows comprising a plurality of subrows.

In this exemplary embodiment a row decoder (0805) decodes the logical row addresses. Additional logic combines the Row Enable signals ($RE_0, \ldots RE_n$) with the higher column addresses such, that the correct subrows are addressed.

Therefore the higher columns address bits for each port—if a multiport memory is construed—are decoded to port specific Subrow Enables ($P_nSE_n$); in the exemplary embodiment this is address $A_2$ of each port (i.e. port 0: $P_0A_2$, . . . port n: $P_nA_2$). The respective port specific Subrow Enable signals of each port are logically combined (e.g. using OR-gates) to port comprehensive Subrow Enable signals (e.g. $SE_0$, $SE_1$). Those are then logically combined (e.g. using AND-gates) with the Row Enable signals ($RE_n$) to control the respective wordline ($We_n$). While the master row (the original row being formed by the folded subrows) is addressed by the row address, each port can dedicatedly control the column addresses and control therefore the selection of the respective subrows). For example the master row of subrows 0801 and 0802 is 0811 driven by $RE_0$.

Figure 4:
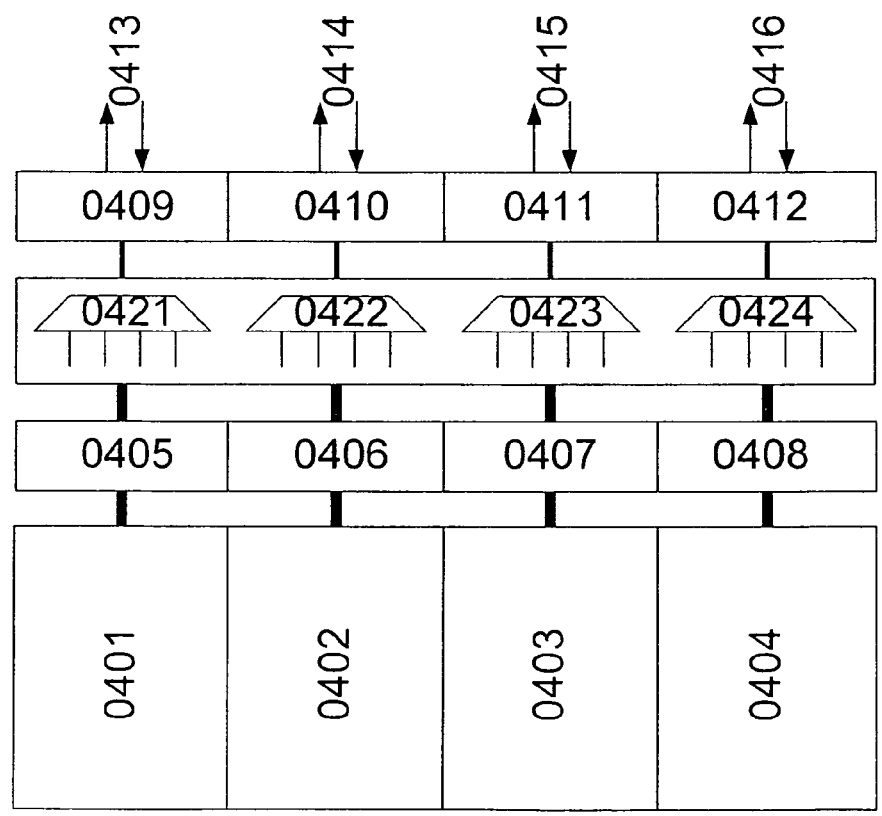
FIG. 4 is a diagrammatic illustration of an example memory having four banks.

The following table compares the use of the address bits in a standard flat SRAM implementation having 8 columns similar to FIG. 4 and the exemplary embodiments of FIG. 6 to a folded SRAM implementation having only 4 columns but twice the amount of rows, as each master row (e.g. 0811) consists of 2 subrows similar to FIG. 8.

|  | flat SRAM (e.g. FIG. 4/FIG. 6) | folded SRAM (e.g. FIG. 8) |
|---|---|---|
| $A_0$ | select column | select column |
| $A_1$ |  |  |
| $A_2$ |  | select subrow |
| $A_3$ | select row | select masterrow |
| $A_4$ |  |  |
| ... |  |  |
| $A_n$ |  |  |

The physical width of the folded SRAM is about half (not exactly have as there is other logic as e.g. decoders, buffers and registers surrounding the SRAM array) of the flat SRAM. Yet, both SRAMs provide the same simultaneous accessibility in terms of wordlines accessible in parallel.

Folding SRAM rows is not only applicable on multiport memories but also on memories operating at large word sizes, e.g. instruction or microcode caches. For example VLIW processors and modern CISC cores (such as the Intel architectures) process many instructions in a single clock cycle and therefore need wide instruction caches. This applies in particular on trace-cache memories storing wide microcode. The large number of bits to be transferred per cycle may lead to a less than ideal aspect ratio in which the SRAMs are getting too wide. Folding the rows might be an ideal solution to readjust the width and height of an SRAM without limiting the number of bits being transferable in a single cycle.

Accordingly the inventive SRAM provides simultaneous and/or parallel access to random addresses within a vicinity, e.g. of a base pointer or within a certain range.

It shall also be mentioned, that many memories of the state of the art require multiport (including dual-port or two-port access). Often the respective addresses are in such close vicinity that the described limitation of only accessing the content of one selected row in parallel is acceptable. In case two addresses reference different rows, a penalty access cycle might be inserted for executing the accesses sequentially one after another.

Such memories in the state of the art might be but not limited to caches, tag-memories, buffers, and even DRAM main memory etc. It shall be expressively mentioned that the described invention is not only applicable on SRAM but also on all other kind of memories which cells are arranged in an array such as DRAMs, Flash and other memories as e.g. described in [2] for instance.

Memory Power Optimization

Several techniques to reduce the power dissipation of e.g. SRAM memories are known, reference is made to [9] chapter 12.2.6. Further significant potential for power savings is located in the precharge circuitry. Reference is made to [10] "Minimizing Test power in SRAM through Reduction of Pre-charge Activity" and [11] "Efficient March Test Procedure for Dynamic Read Destructive Fault Detection in SRAM Memories". [11] describes "that read or write operations on a cell involve a stress on the other cells of the same word line. This stress, called Read Equivalent Stress (RES), has the same effect than a read operation." [10] identifies "two main sources of power consumption in the unselected columns related to the precharge activity. Firstly, the cells in the unselected columns consume power due to the RES. Secondly, there is power dissipation in the pre-charge circuits of these columns because they are always ON." Further the paper states that "in the normal operation mode of a random access memory, this precharge activity is essential and the RES is tolerated, because at the end of each operation all the columns of the array, including the current selected column, need to be ready for the next operation, whose location is unpredictable."

Figure 7:
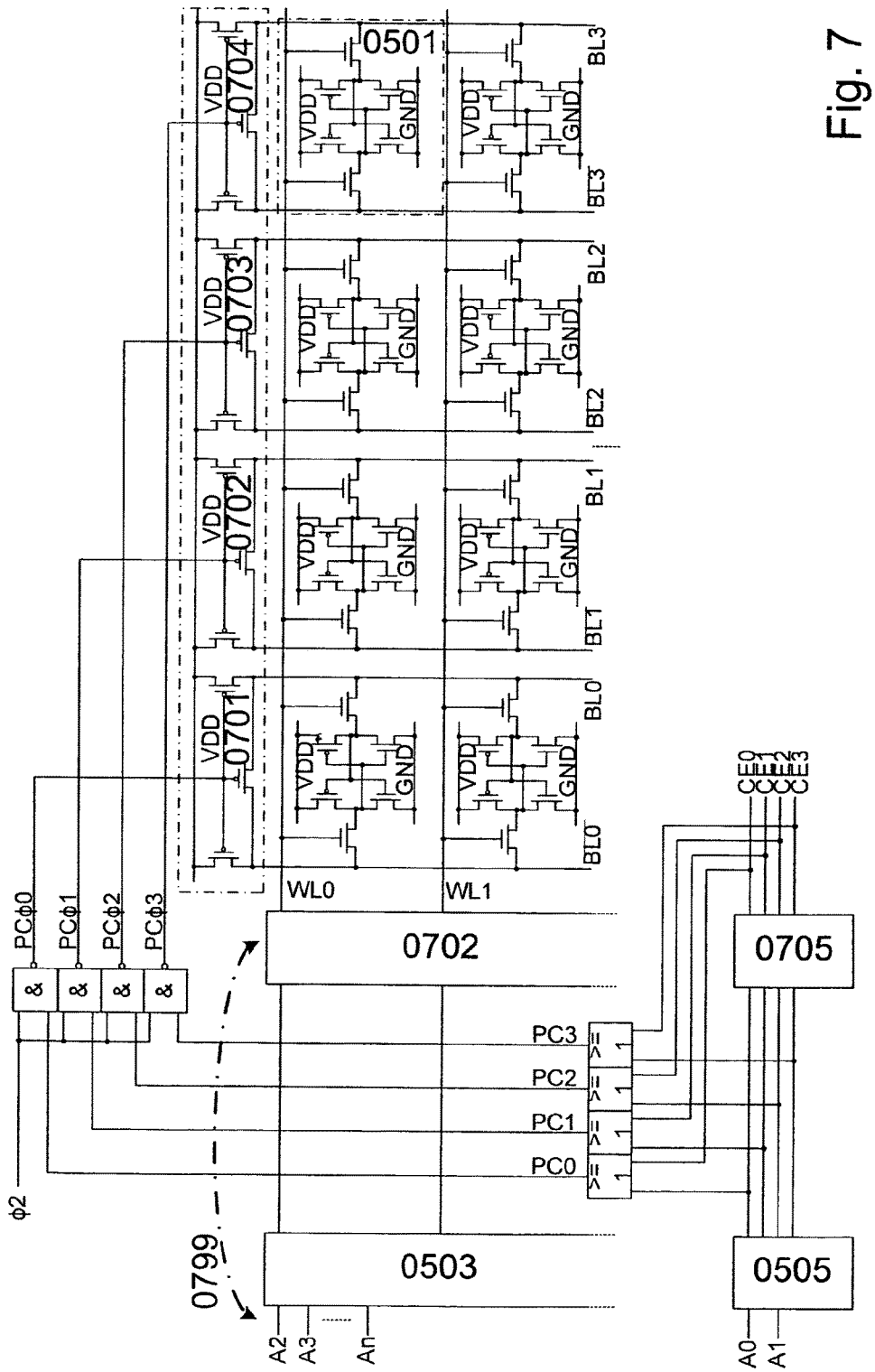
FIG. 7 is a diagrammatic illustration of an example section of an SRAM including switchable bitline conditioning units.

FIG. 7 exemplary shows switchable bitline conditioning units which precharge operation can be selectively enabled for each row depending on the current and subsequent address. Only a relevant section of an exemplary SRAM is shown. Based on the exemplary SRAM memory of FIG. 5, the four precharge units (0701, 0702, 0703, 0704) are modified for being independently controllable by having independent enable signals (PC$\phi_0$, PC$\phi_1$, PC$\phi_2$, PC$\phi_3$).

The column addresses for cycle t+1 are decoded by the column decoder 0505 to column enable signals which are registered in the register 0705. The output of the register delivers the column enable signals $CE_0$, $CE_1$, $CE_2$ and $CE_3$ of the current cycle t. The column enable signals of the current cycle t and the subsequent cycle t+1 are therefore present at the output respectively input of register 0705. The column enable signals of the current and subsequent cycle are logically or-combined for each column resulting in dedicated precharge signals for each of the columns ($PC_0$, $PC_1$, $PC_2$, $PC_3$) covering the precharge enable for the current cycle t and the subsequent cycle t+1. Those are individually logically combined (e.g. nand-combined) with the clock generating the independent enable signals PC$\phi_0$, PC$\phi_1$, PC$\phi_2$, and PC$\phi_3$.

The row enable signals, i.e. the wordlines $WL_n$ have also to be registered to match the registered column enable signals $CE_n$. Respectively a register 0702 is inserted for delaying the writelines $WL_n$ by one clock cycle. However, it is ultimately a design choice whether such register is located before or after the row decoder 0503, indicated by the arrow 0706.

In an alternative and even preferred embodiment the register (0702) is located in front of the decoder (0503) registering the row addresses (instead of the wordlines). This is indicated by arrow 0799. Obviously such a register is significantly smaller as it holds only n bits compared to $2^n$ if located behind the decoder.

The optimized precharge circuitry is obviously applicable on the (multiport) memories discussed before. In FIG. 8 a slightly modified embodiment is shown, in which the two precharge blocks 0803 and 0804 are independently controlled by the respective Subarray Enable signals ($SE_0$ and $SE_1$) which are logically combined (0811) (e.g. by nand-gates) with the $\phi 2$ clock signal to drive the precharge circuits on a subarray granularity. Other embodiments may, as described, drive the precharge circuits independently for each column or in an advanced version independently for each column and subarray by logically combining the subarray and column enable signals.

Independent Memory Banks and/or Caches

The inventive concepts are applicable on the memory system described in [1], which is completely incorporated by reference into this patent for full disclosure. Particularly reference is made to FIG. 9 of [1] and the respective description. The memory system is described in more detail in [2], which is also completely incorporated by reference into this patent for full disclosure. Particularly reference is made to FIGS. 8, 9 and 10 of [2] and the respective description. Those memories systems are based on Tightly Coupled or Locally Coupled Memories (TCM or LCM). Other TCM memory systems are known in the prior art, e.g. from [11] Chapter 5.

However, such kinds of memories require additional management. For example in software has to explicitly manage TCM memories according to [11] and move data between them and the higher memory hierarchies. Or for example in case of [2], at least the address space of the TCM/LCM has to be explicitly managed.

Source code analysis showed that ideally at least for some of the base pointers dedicated data caches are implemented, such that they are independently and parallel accessible.

Figure 9A:
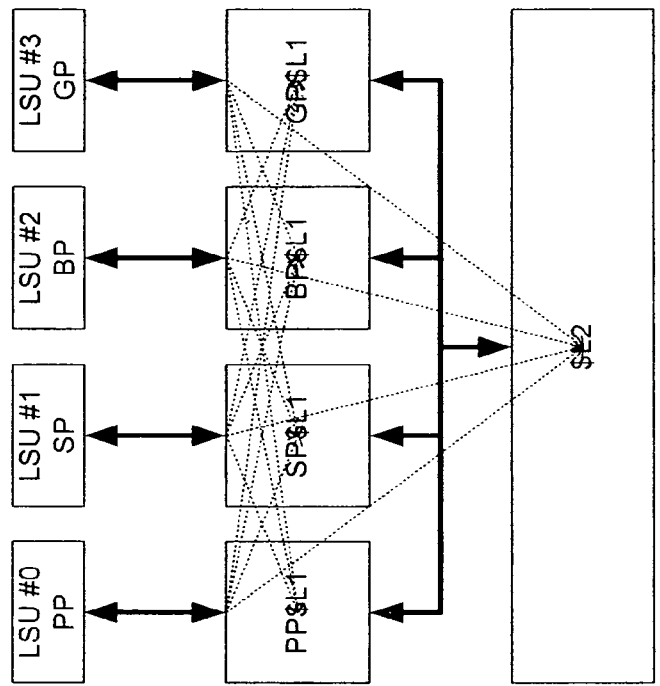
FIGS. 9a and 9b are diagrammatic illustrations of example implementations of a memory hierarchy.
Figure 9B:
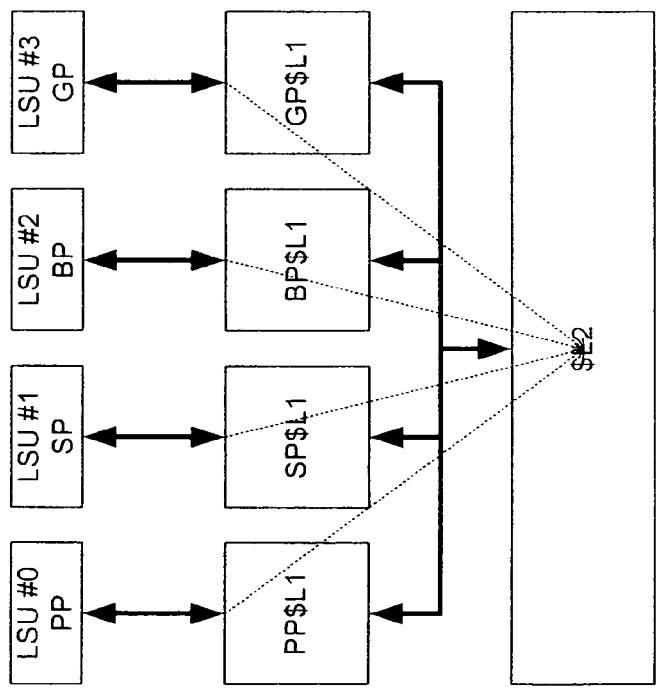

FIG. 9a and FIG. 9b show exemplary embodiments of the inventive memory hierarchy. As described in [1] a plurality of independent Load/Store Units (LSU) are implemented, each covering a specific address range. Those LSU are preferably dedicated to specific base addresses. In this exemplary embodiment 4 LSU are supported:

PP, the Program Pointer for accessing constants
SP, the Stack Pointer accessing the stack and local data
BP, a Base Pointer, e.g. to the heap
GP, a General Purpose LSU accessing a random address range However, preferably more dedicated Base Pointers are supported, for example 3 (BP0, BP1, BP2) of which e.g. BP0 and BP1 might be used for addressing read data and BP2 for addressing write data. This arrangement supports the most common functions and algorithms.

Each of the LSU is connected to a dedicated Level 1 Cache ($L1, e.g. PP$L1, SP$L1, BP$L1, GP$L1), so that preferably all the LSU can simultaneously transfer data to or from their specific $L1.

Note, that within this patent $L1 is used for a Level 1 Cache, $L2 for a Level 2 Cache, etc. A prefix might be used to point to a specific cache, e.g. SP$L1 is the Level 1 cache dedicated to the Stack Pointer. Without a prefix any Level 1 cache is meant, sometimes even a plurality if Level 1 caches can be meant. However, typically a plurality of Level 1 caches is referenced as $L1s.

In a preferred embodiment cache memories comprising the SRAMs described in this patent are used, so that each LSU can access a plurality of addresses within a vicinity of the specific base pointer in parallel.

In an optimal case, the address ranges of the LSU do not overlap, so that each LSU is operating exclusively in the respective address range. In that case no coherence issues exist. However, typically this is not the case or at least cannot be taken for granted. Particularly the General Purpose address pointer in LSU#3 might point into any address range without limitations.

Preferably the high level language compiler (e.g. C, C++ compiler) optimizes the address pointers and address ranges to minimize overlapping address accesses.

However, as usually the LSU should operate exclusively within dedicated address ranges a full coherence protocol (e.g. such as MESI) is inadequate particularly in terms of silicon area and bandwidth requirements and energy consumption.

Based on the policy that each LSU should operate exclusively within its dedicated address range, the $L1 operated as exclusive caches. This means, that a data block within an address range is only covered by one single cache. No duplicate data blocks within the same address range may exist in different $L1.

Exclusive $L1s reduce coherence issues to cache misses. The access sequence is such:
1. Check respective $L1 cache for address.
   1.1. Hit: Initiate data transfer and terminate.
   1.2. Miss: Continue with searching other caches ($L1s and $L2). Continue with 2, the respective $L1 cache is called requesting-$L1 as it request the data from the memory (cache) where it is currently located.
2. Search
   2.1. Data is found in another $L1 (containing-L1), the containing-$L1 must be accessed for the data transfer. Still no coherence issues exist, particularly no locking mechanism are required, as the timely sequence of the memory accesses is driven by the instruction issue sequence of the processor core connected to the LSUs. In one embodiment the TAG memory of the requesting-$L1 might be updated so that it points to the containing $L1. In this case, future accesses can avoid searching the caches, but directly access the data in the containing-$L1. This mechanism might serve access time and particularly energy. While typically data is only accessed in the containing-$L1, data might be moved from one $L1 (containing-$L1) to a second L1 (requesting$L1) so that is exclusively resides in the second one (requesting-$L1), if the second $L1 (requesting-$L1) accesses the data more frequent than the first one (containing-$L1) in which the data currently resides. Reference is made to description of data move methods and systems described in [2] discussing this issue between multiple processor cores. The same mechanisms are (possibly with little modification and optimization) applicable on this invention. It shall be explicitly noted that for the purpose of disclosure [2] is embodied into this patent and claims may include features of the specification of [2].
   2.2. If the data is not found in any other $L1, it will be loaded from the higher memory hierarchy into the requesting $L1 (e.g. $L2, $L3, main memory, disc, server, internet, etc).

The used mechanisms depend on the implementation of the cache hierarchy, e.g. on inclusive or exclusive caching within the hierarchy (not only in between the $L1s).

Multi-level caches introduce new design decisions. For instance, in some processors, all data in the $L1 must also be somewhere in the $L2. These caches are called strictly inclusive. Other processors (like the AMD Athlon) have exclusive caches—data is guaranteed to be in at most one of the $L1 and $L2 caches, never in both. Still other processors (like the Intel Pentium II, III, and 4), do not require that data in the $L1 also reside in the $L2, although it may often do so. There is no universally accepted name for this intermediate policy.

The advantage of exclusive caches is that they store more data. This advantage is larger when the exclusive $L1 is comparable to the $L2, and diminishes if the $L2 is many times larger than the $L1. When the L1 misses and the L2 hits on an access, the hitting cache line in the $L2 is exchanged with a line in the $L1. This exchange is quite a bit more work than just copying a line from $L2 to $L1, which is what an inclusive cache does.

One advantage of strictly inclusive caches is that when external devices or other processors in a multiprocessor system wish to remove a cache line from the processor, they need only have the processor check the $L2. In cache hierarchies which do not enforce inclusion, the L1 cache must be checked as well. As a drawback, there is a correlation between the associativity of $L1 and $L2 caches: if the $L2 does not have at least as many ways as all $L1s together, the effective associativity of the $L1s is restricted. Another disadvantage of inclusive cache is that whenever there is an eviction in $L2, the (possibly) corresponding lines in $L1 also have to get evicted in order to maintain inclusiveness. This is quite a bit work, and would result in higher L1 miss rate. Another advantage of inclusive caches is that the larger cache can use larger cache lines, which reduces the size of the secondary cache tags. (Exclusive caches require both caches to have the same size cache lines, so that cache lines can be swapped on a $L1 miss, $L2 hit). If the secondary cache is an order of magnitude larger than the primary, and the cache data is an order of magnitude larger than the cache tags, this tag area saved can be comparable to the incremental area needed to store the $L1 data in the $L2.

FIG. 9a shows the search mechanism in case of a cache miss in a $L1 ($L1miss) in either case, an exclusive or inclusive cache hierarchy.

In both chases the $L2 and all other $L1s have to be searched for the respective address range. The search is initiated after a cache miss and the TAG memory of all other $L1s and the $L2 is checked for the respective address.
  a) If the address is found in an $L1, the $L1 is accessed for the data transfer and/or the cache line might be transferred from the $L1 into the $L1 ($L1miss) requiring but missing the data (see [2]).
  b) If the address is found in $L2, the cache line is transferred into $L1miss.
  c) If the address is not found in any $L1s or the $L2, it is transferred from the higher memory hierarchy.

FIG. 9b shows a modified inclusive cache hierarchy. All data stored in the $L1s must also be present in the $L2, at least (as will be discussed) in the TAG memory of the $L2. The TAG memory of the $L2 keeps track of the whereabouts of all addresses in the $L2 and lower level $L1s. The $L2 TAG memory is respectively enhanced not only to reference its own cache lines, but also to reference to cache lines of the lower $L1 caches. It is not necessary, that the $L2 actually has copies of data in the $L1(s) stored, but at least respective entries in the TAG memory are required to point to the location where the data is actually stored. If a respective address is available in a $L1, the $L2 TAG will point to the specific $L1.

The benefit of this embodiment is that in case of a $L1 cache miss only the TAG of the $L2 is checked (while in FIG. 9a all $L1s have also to be checked). This might be more power efficient than checking all caches in parallel.
  a) If a TAG entry in the $L2 TAG memory is pointing to a $L1, the respective cache is accessed. As described before data might be transferred or the complete cache line (see [2]). In case the cache line is transferred, the TAG in the $L2 is accordingly updated.
  b) If no TAG entry in the $L2 TAG memory is found, data is transferred from the higher memory hierarchy.

Also a modified exclusive policy might be implemented, in which data resides either in one of the $L1s or the $L2. Yet, the TAG memory of the $L2 serves as an address book for all addresses in the $L1s and $L2, so that it points to the cache (either one of the $L1s or the $L2) storing the data.
Effects on Code, Compilers and Tools In the following the invention is discussed with some examples based on analysis of C/C++ code of a H.264 video encoder and decoder (namely X.264[12]), which has been compiled to ARM assembly code using a GNU GCC compiler environment.

First reference is made to a section within the code of <x264_fdec_filter_row>:

| 0000075a: | ldr  | r0, [pc, #600] |
| 0000075c: | movs | r6, #0         |
| 0000075e: | ldr  | r7, [pc, #580] |
| 00000760: | str  | r6, [sp, #36]  |
| 00000762: | mov  | r8, r0         |
| 00000764: | str  | r3, [sp, #68]  |
| 00000766: | ldr  | r0, [sp, #36]  |
| 00000768: | ldr  | r1, [sp, #56]  |
| 0000076a: | ldr  | r5, [sp, #52]  |
| 0000076c: | asrs | r1, r0         |
| 0000076e: | asrs | r5, r0         |
| 00000770: | mov  | fp, r1         |
| 00000772: | cmp  | r5, fp         |

In lines 75a and 75e data is loaded (ldr) from a memory position relative to the program pointer (pc). The addresses are PP relative at pc+#600 and pc+#580 and therefore in a close vicinity. It shall be noted that the ARM instruction set references to the Program Pointer (PP) as Program Counter (PC), which are both the same. The movs instruction in line 75c can be swapped with either one of the load instructions in lines 75a or 75e; obviously the offsets to the program counter (pc) must be respectively adapted.

The two load instruction can now be merged (or fused) into a combined single load instruction (combined load: cldr), either by the compiler using a respectively amended instruction set or by the processor hardware. Both options are discussed in later sections of this patent.

The combined single load instruction (cldr) operates in a single load transfer, particularly if the inventive SRAM as previously described is used, e.g. as cache ($L1 and/or $L2 and/or even for higher memory hierarchies). The performance benefit of merging the two load operations can easily be calculated. Assuming modern $L1 implementations requires 4 clock cycles latency, an overall of 4 cycles is saves, as both read operations are simultaneously processed. Power is saved respectively, as the address transmission and cache (or higher level memory) access occurs only once.

Furthermore in lines 766, 768 and 76a load accesses (ldr) relative the Stack Pointer (sp+#36, sp+#56 and sp+#52) are performed. Again, all three load instructions can be merged into a single one performing the three accesses in one transfer. Obviously in this case 8 clock cycles are saved and a respective amount of power.

Store operations are not as time consuming, thought combining store operations (e.g. in line 760 and 764) saves processing cycles and reduces the energy consumption.

In one particular embodiment store and load operations might be merged (or fused) together. Assuming an instruction set and/or processor architecture supports parallel memory trans-actions (mixed load and/or store transfers) to 4 addresses within a vicinity of a base pointer. In that case, the store and load instructions in lines 764, 766, 768 and 76a might be combined into one single transfer. The previously described SRAM for example supports random simultaneous read and/or write operations within a vicinity, i.e. the addressed row or master row.

The following code section is part of <x264_encoder_encapsulate_nals>:

| 00000b86: | ldr  | r4, [r3, #0] |
| 00000b88: | adds | r3, r1, #0   |

|         |      |            |
|---------|------|------------|
| 00000b8a: | adds | r0, r0, r4 |
| 00000b8c: | adds | r6, #1 |
| 00000b8e: | adds | r3, #76 |
| 00000b90: | ldr  | r5, [r3, #0] |
| 00000b92: | adds | r6, #1 |
| 00000b94: | adds | r0, r0, r5 |
| 00000b96: | adds | r3, #28 |
| 00000b98: | ldr  | r7, [r3, #0] |
| 00000b9a: | adds | r6, #1 |
| 00000b9c: | adds | r0, r0, r7 |
| 00000b9e: | adds | r3, #28 |
| 00000ba0: | cmp  | r2, r6 |

The instructions can be rearranged (at runtime by the processor hardware and/or software tools and/or a compiler) as follows:

|      |              |
|------|--------------|
| adds | r3', r1, #0 |
| adds | r3', #76 |
| adds | r3", r3', #28 |
| ldr  | r4, [r3, #0] |
| ldr  | r5, [r3', #0] |
| ldr  | r7, [r3", #0] |
| adds | r0, r0, r4 |
| adds | r6, #1 |
| adds | r6, #1 |
| adds | r0, r0, r5 |
| adds | r6, #1 |
| adds | r0, r0, r7 |
| adds | r3, #28 |
| cmp  | r2, r6 |

The load instructions (ldr) having a common base pointer r3 been moved up and grouped. The address generation for the load instructions has been separated, grouped, and placed in front of all the load instructions (ldr). Further discussion is required on the use of register r3 and adding r1 to r3 in adds r3', r1, #0:

Register r3 is used as address in all load (ldr) operation. Grouping the load operations, separating and grouping the address generation results in an incorrect use of register r3. This can be avoided in various ways. If the reordering is done in hardware, virtual registers might be introduced for the different r3 registers. This is indicated by r3' and r3".

If already a compiler groups and orders the instructions respectively, the register allocation may use different registers for each of the r3 (r3, r3' and r3"). This is shown in the code below, in which r3' is replaced by r5 and r3" by r7 respectively:

|      |              |
|------|--------------|
| adds | r5, r3, r1 |
| adds | r5, #76 |
| adds | r7, r5, #28 |
| ldr  | r4, [r3, #0] |
| ldr  | r5, [r5, #0] |
| ldr  | r7, [r7, #0] |
| adds | r0, r0, r4 |
| adds | r6, #1 |
| adds | r6, #1 |
| adds | r0, r0, r5 |
| adds | r6, #1 |
| adds | r0, r0, r7 |
| adds | r3, #28 |
| cmp  | r2, r6 |

The value of r1 is unknown, at least at compile time. Therefore r3' might be outside the vicinity supporting parallel access. While this might be theoretically an issue, practically each address (even those being generated by known constants (e.g. adds r3', #76) must be checked for being within the vicinity of parallel accessibility of the data. This check can be implemented in various locations, for example within the load/store unit (LSU) or within the cache management or even within the memory (e.g. the previously described SRAM). If addresses within a group (e.g. ldr r4, [r3, #0], ldr r5, [r3', #0], ldr r7, [r3", #0] in this example is called a group) are in different vicinities, the access must be split into a multi-cycle address. One access cycle is required for each of the vicinities. While ideally all addresses within a group are within the same vicinity, worst case each address might be in a completely different one, so that for each address a separate access cycle is required. Correct operation must be ensured by the hardware.

In the example below (which is part of <x264_encoder_delayed_frames>) pointer arithmetic is used to generate addresses. A pointer is retrieved by a first load instruction, which is then added to a base pointer generating the address of a second load operation:

|         |      |            |
|---------|------|------------|
| 000000b0: | movs | r6, #171 |
| 000000b2: | lsls | r1, r6, #2 |
| 000000b4: | adds | r7, r4, r1 |
| 000000b6: | ldr  | r3, [r7, #0] |
| 000000b8: | ldr  | r6, [r3, r2] |
| 000000ba: | movs | r3, #8 |
| 000000bc: | adds | r5, r5, r6 |
| 000000be: | movs | r7, #170 |
| 000000c0: | adds | r1, r4, r3 |
| 000000c2: | lsls | r6, r7, #2 |
| 000000c4: | adds | r7, r1, r6 |
| 000000c6: | ldr  | r1, [r7, #0] |
| 000000c8: | adds | r3, #4 |
| 000000ca: | ldr  | r1, [r1, r2] |
| 000000cc: | adds | r5, r5, r7 |
| 000000ce: | movs | r1, #170 |
| 000000d0: | adds | r6, r4, r3 |
| 000000d2: | lsls | r7, r1, #2 |
| 000000d4: | adds | r1, r6, r7 |
| 000000d6: | ldr  | r6, [r1, #0] |
| 000000d8: | adds | r3, #4 |
| 000000da: | ldr  | r1, [r6, r2] |
| 000000dc: | adds | r5, r5, r1 |
| 000000de: | cmp  | r3, r0 |

The code is transformed as previously described such, that the first load operations acquiring the pointers are grouped together in a first group and the second load operations reading the data on basis of the pointer are grouped together in a second group:

|      |              |
|------|--------------|
| movs | r6, #171 |
| lsls | r1, r6, #2 |
| adds | r7', r4, r1 |
| movs | r3, #8 |
| movs | r7, #170 |
| adds | r1, r4, r3 |
| lsls | r6, r7, #2 |
| adds | r7", r1, r6 |
| adds | r3, #4 |
| movs | r1, #170 |
| adds | r6, r4, r3 |
| lsls | r7, r1, #2 |
| adds | r1, r6, r7 |
| ldr  | r3', [r7', #0] |
| ldr  | r1', [r7", #0] |
| ldr  | r6', [r1, #0] |
| adds | r3, #4 |
| ldr  | r6, [r3', r2] |
| ldr  | r7, [r1', r2] |
| ldr  | r1, [r6', r2] |
| adds | r5, r5, r7 |

```
adds        r5, r5, r6
adds        r5, r5, r1
cmp         r3, r0
```

The address generation for the first group is moved in front of the entire group, where necessary (as previously discussed) registers are replaced by virtual registers (in a hardware based optimization within the processor at runtime) or the register allocation of a compiler (at compiler time) would allocate the registers correctly. Ultimately the addresses of each block might or might not be within a vicinity. If so all transfers within a group are performed in parallel and several clock cycles might be saved. If not, the hardware will perform the respective transfers sequentially where necessary.

Optimization at Compile Time

The most efficient code optimizations for supporting the inventive memory access are done at compile time. The compiler might perform various optimizations:
1. Arrange addresses of variables and constants such, that those typically or likely being accessed in timely vicinity are located in the memory in close address vicinity.
2. Combine a plurality memory accesses into groups.
    a. If the instruction set of the processor supports memory instructions having multiple addresses and performing multiple transfers, use such instructions.
3. Position (naturally) all necessary address calculations in front of said groups.
4. Allocate registers respectively.

Optimization at Execution Time

Processors might perform all or some of the described optimizations at runtime. For example if non-optimized binaries are executed. Also, for example grouped load and/or store instructions might be combined (fused) into one (single) internal instruction or microcode.

Instruction Decoder (ID)

At this level simple optimizations can be performed, such as combining a plurality of grouped load and/or store instructions into one (single) internal instruction or microcode.

Trace Cache, Reservation Station/Reorder Buffer

The binary code might be reordered and grouped in at least one of the Trace Cache, the Reservation station(s) and/or the Reorder Buffer. A similar optimizer is described in [4]. It shall be explicitly noted that for the purpose of disclosure [4] is embodied into this patent and claims may include features of the specification of [4]. One downside of most algorithms however is that the optimization can only be performed after the whole section of the code has been analysed. In other words, the end of a code section must be known and analysed before the beginning of the code can be modified. This means that
    either whole sections of the code must be first read into a buffer (e. the Trace Cache, the Reservation station(s) and/or the Reorder Buffer), analysed and optimised before it can be executed;
    or during a first execution run the code is executed in its original version and analysed at the same time, so that at a later execution run an optimized version of the code might be available and is executed. In this case, the optimized code might be available for execution already in the second run or the second (and possible even further runs) might be required for further optimization and/or even analysis.

Microcode Fusion

Combining (or fusing) a plurality of load and/or store operations into one operation, e.g. a microcode, has been described. This microcode is then executed in a single execution cycle. Only if at least some of the addresses of the plurality of transfers being fused into the single microcode are not within a vicinity, multiple cycle might be required for execution.

The fusion of decoded instructions, so called microcodes, into fused microcodes is known from microprocessors. Reference is made to [8] chapter 58, e.g. section "pop Fusion". However, only microcodes derived from the same instruction (macro-op) are fused, reference is made to [13]. Fusing microcode from different instructions and particularly fusing a plurality of load and/or store microcodes is not known in the prior art and regarded as inventive step is the fusion of a plurality of load and/or store operations into one microcode (or operation) as described in this patent.

Microcode Splitting

Some processors, particularly CISC processors as e.g. the IA family from Intel (e.g. x86: Pentium, Core1, Sandybridge, etc) do not only have dedicated memory instructions (such as load and/or store), but also support memory operations within other instructions and software may even extensively use this feature.

It is necessary to separate the function of an instruction from the load and/or store operation such, that the load/store operation can be independently performed from the (other) function. Therefore the instruction is split into at least a function (micro-)code and a load/store (micro-)code at execution time, typically by the instruction decoder (ID). The at least two parts might be treated differently in later stages of execution. Particularly the load/store (micro-)code might be reordered and grouped/fused together with other load/store (micro-)codes as described. This steps are not known in the prior art and regarded inventive.

If a load/store (micro-)code is separated from other parts of an instruction, the respective operand or result must be replaced by a reference to the separated load/store (micro-)code. A register of the register file might be used, but this would influence other operations. Therefore it is preferred to reference via a virtual register and/or dedicated load store registers, which might be implemented (e.g. as part of the load/store units (LSU)) for enhancing the register file and transferring data between the execution unit of the processor and the memory hierarchy.

FIG. 10 demonstrates the effects of the invention, particularly in respect of Microcode splitting and fusion, on CISC instructions. The example uses Intel x86 instructions which are implemented for example in the Pentium, Core1 and Sandybridge processors. A very simplistic microcode format is used in this example, mainly the assembly instructions are replaced by microcode instructions in "<<" and ">>" brackets. Besides only little is transformed, as the goal of this example is solely to demonstrate said load/store optimizations.

An exemplary Finite Response Filter (FIR) core written in x86 assembly language is shown in FIG. 10a. The processor hardware (typically the instruction decoder (ID)) transforms the binary of the assembly code into microcode.

As shown in FIG. 10b load and/or store transfers are separated (ldr=load data, str=store data) from the other operations (e.g. ALU operations), virtual registers (vr0, vr1, . . . , vr4) link the operations with the load and/or store transfers.

Load transfers are pulled up to be executed as early as possible, store transfers may remain in their original position or might be alternatively pulled down (FIG. 10c).

Memory transfers using the same base are combined, particularly if they likely operate in an address vicinity—which is easy to check in the given example: The offsets eax*4, eax*4+4, eax*4+8, eax*4+12 are in a close vicinity; the same register and multiplier (shift left) are used as comparators can check, together with the little difference between the constant values, 0, 4, 8, and 12. FIG. 10d shows a micro-operation (micro-op) ldrm4 in which the 4 load transfers descending from different instructions are combined (or fused).

In this example the Load/Store Units (LSU) are capable of handling 4 requests simultaneously. If the execution of 5 simultaneous requests is supported (ldrm5, 1001) also the $5^{th}$ load operation might be included. It uses the register ecx instead of eax as offset, which might be out of range and therefore not within the required vicinity. However, as previously described, range checking is preferably supported in hardware, so that basically random addresses may exist within a single memory transfer instruction (e.g. ldrm4, ldrm5): The execution of the ldrm5 operations would be split into (at least) 2 cycles in case ecx is out of range, so that the load transfer depending on ecx is managed in a separate cycle.

As described before, the optimization tools described in [4] can be respectively amended to support the shown optimization.

Scheduler Controlled Cache, LCM, and/or TCM Prefetching

A Locally or Tightly Coupled Memories (LCM or TCM) as e.g. described in [2] provide ideal performance once they are dedicated to a specific application. However, task or thread switches might be comparably inefficient if the data of the old task has to be saved from the respective memory to the main memory hierarchy and data of the new task has to be loaded. The process is time consuming beyond the order of magnitude of the typical time consumed by a task or thread switch. Therefore, in the prior art, TCM are mainly dedicated to a single or only a few application(s) and limited to embedded processing.

Ideally loading or off-loading (storing) of TCM and LCM data is performed in the background, prior to or after a task or thread switch.

In one embodiment, the task scheduler of the operating system and/or the application program provides information of the next scheduled task/thread or (if supported by the implementation of the task scheduler) tasks/threads to the processor. A buffer structure, e.g. a FIFO, might store the respective list of tasks/threads (TTL) in their scheduled execution order. A DMA-like (DMA=Direct Memory Access) Data Move Unit (DMU) preloads TCM and/or LCM data required by the subsequent task/thread in advance from the memory hierarchy, while the current task/thread is still running.

Multi-Buffer TCM/LCM Caching

Overlapping processor operations on TCM/LCM and the loading and/or off-loading of data requires to implement these memories (which are e.g. described in [2]) as at least doublebuffers comprising at least two memory banks: While one bank is assigned to the processor core for data operation executing the application, the other bank is assigned to the data move unit (DMU) for off-loading the data of the previous task/thread and loading the data of the subsequent task/thread.

Processor build for application getting high benefit from TCM/LCM might have more focus on these memories at the expense of caches. Spending more area for LCM/TCM enables multi-bank LCM/TCM implementations, as exemplary shown in FIG. 13. A Tightly Coupled or Locally Coupled Memory (TCM/LCM) 1301) comprises a plurality of memory banks (1302, 1303, 1304, 1305, 1306).

A Memory Management Unit (MMU) (1311), which might be part of the main Memory Management Unit or a separated Memory Management Unit, one or more memory banks (1302, 1303, 1304, 1305, 1306) are assigned to the processor core (1321) at runtime according to the currently executed task and/or thread. The assignment depends on the respectively executed task/thread and is managed by the MMU based on information regarding the currently executed (scheduled) task/thread, as e.g. task/thread-identification (ID) or a base address. Data for a plurality of tasks/treads is storable in the LCM/TCM memory, for each preferably in another related memory bank. At runtime of the task the related memory bank is assigned to the processor core.

A DMU (1331) is loading and off-loading the data from and to the memory hierarchy (1341). The DMU operates on a list (TTL) of data for tasks/threads to be loaded and off-loaded. I a preferred embodiment, the MMU provides this list (1312) to the DMU. In this embodiment, the MMU manages the list (TTL) of tasks/threads to be started next. The MMU being in control of the accessible pages (respectively TCM/LCM banks) recognizes upcoming page misses, if the pages required for a task/thread in the TTL are not available in the TCM/LCM (1301). Consequently the MMU issues a bank/page load request to the DMU (1312).

Depending on the Page Replacement Policy (which might be implemented in the MMU or provided by the Operating System) it is decided which TCM/LCM pages/banks have to be evicted. As the MMU is in control of the accessible pages (or banks), is also issues the respective bank/page off-load request to the DMU (1312). Naturally a bank, if it was previously in use by a task/thread before, has to be off-loaded before it is loaded with data of a scheduled subsequent task/thread.

Register File Buffering

Figure 9C:
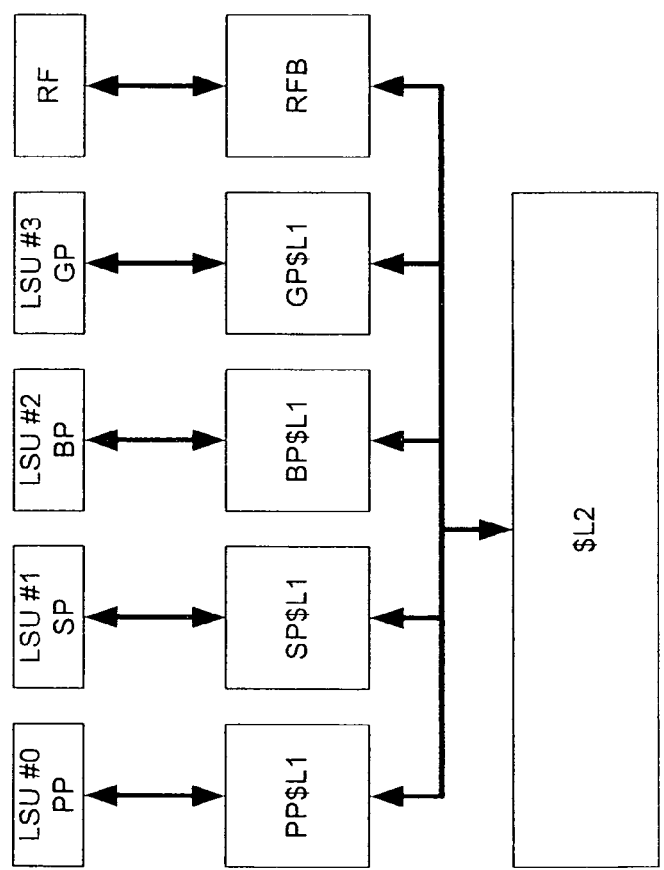
FIG. 9c is a diagrammatic illustration of an example implementation of a cache/buffer model for a memory hierarchy.

Reference is made to FIG. 9 again. FIG. 9c shows an advanced cache/buffer model. The processors Register File (RF) is connected to a Register File Cache or Register File Buffer (RFB), which then connects to the main memory hierarchy, e.g. the Level-2 cache ($L2). This structure is particularly beneficial in processors having a large register file. One example are ZZYX processors, which FIFO register file can have comprise hundreds to thousands of registers (e.g. 16 registers times 16 FIFO stages deep=256 registers total; 64 registers times 32 FIFO stages deep=2048 registers total). Other examples are Sun Sparc processors having register windows, providing a reduced view of a huge register file. Yet another example are modern x86 processors, as e.g. Intel Core1 and Sandybridge having about 200 registers.

In the prior art, for context switching those registers are loaded from (pop) and off-loaded to (push) the Level-1 cache. This leads to various issues, e.g. but not limited to: a) the cache gets easily trashed; b) the cache bandwidth is either limited or large cache interfaces are required; c) this may lead to increase area and power dissipation.

In a preferred embodiment for context switching the register file is loaded from (pop) and off-loaded to (push) the RFB. The RFB may provide a wider interface, so that a plurality of registers can be moved simultaneously. Additionally or alternatively the RFB might be a multi-bank and/or multi-port memory structure, of which—in some embodiments—the RF might be a subset. In a preferred embodiment the RFB is deep enough to store, depending on the implementation, 4 to 64 (in future even more) complete register file contexts. This allows for fast and efficient exchange of the Register File in case of context switches.

In a preferred embodiment the RFB might comprise multibuffers, as e.g. described in FIG. 13. Particularly the described prefetching and/or loading and off-loading in the background under control of a scheduler is highly efficient and greatly reduces task switching overhead (e.g. time and/or energy).

Depending on the implementation, Instruction Set Architecture and/or programming model a different stack pointer and/or stack might be used for loading and/or off-loading the register file.

In some cases it might be necessary to have a reference to the memory address of the register file. In those cases, the operation off-loading the register file might leave a reference to the address of the off-loaded register file on the normal data stack, just where usually the register file would have been off-loaded to. Whenever the register file is loaded again, the address can be retrieved from the stack at the position at which usually the actual register file would be found on the stack.

In some cases, e.g. if a FIFO Register File is implemented (e.g. according to [1]) only the amount of actually used registers (e.g. FIFO stages or entries) are off-loaded. The actual amount of off-loaded registers (e.g. the FIFO depth) is written onto the stack (e.g. finally at the top of the stack) such, that a subsequent load operation can retrieve this value before the actual load operation, so that the number of registers (e.g. FIFO stages) to load can be correctly determined.

Serial Interface

This part of the invention starts with the perception that a plurality of unrelated serial channels capable of operating independently of each other connecting a plurality of processor cores (e.g. in a multi-core processor or multi-processor system) and/or cache banks (e.g. the previously described independent memory banks and/or caches) to the system memory might be more efficient than the bottleneck of a single parallel bus.

The transfer rate of each serial channel is lower than the one of the parallel bus, but in summa all the serial channels together can achieve the same or even higher transfer rates. Simultaneously serial buses are simpler to handle in complex systems and may consume significantly less power.

Today's multi-core processors interface via one global cache and a global memory controller (which may handle multiple but dependent memory channels) with the system memory.

In difference the inventive architecture provides one or a plurality of serial channels for each of the processor cores to the system memory, eliminating the cache hierarchy and/or memory controller bottleneck. Each serial bus may independently transfer data and operate in specific address ranges. This allows each processor to operate in its own memory space, without impairing the data transfer and caching of the other processors.

It has been recognized, that—as described above—a plurality of address generators (or Load/Store Units) (exemplary see [1] e.g. FIGS. 7 and 9) are beneficial in most applications, allowing each of them to perform on its own address space. Reference is also made to the LCM and TCM of [2]. FIGS. 8 and 9 of [2] show exemplary memory hierarchies for multi-core processor systems. Particularly, as described above, a plurality of caches (e.g. the previously described level 1 caches PP$L1, SP$L1, BP$L1, GP$L1) might be implemented. Obviously the interface to the main memory (0810, 0910) forms the major bottleneck. Ideally, each of the memory channels (e.g. TCM, L1, L1LCM) could access the main memory in parallel via serial interfaces. This is particularly beneficial if data buffers are implemented in the memory channels, which hold data of a specific address range. If multiple memories (e.g. TCM, PP$L1, SP$L1, BP$L1, GP$L1) use a single channel, likely the buffers will be continuously trashed as each source likely operates in a different address range.

For achieving higher bandwidth, a processor core may combine a plurality of its serial channels, if high data bandwidth from a single address range is required.

On the memory side, each serial interface preferably connects to a dedicated memory or memory bank, allowing independent parallel access to the plurality of memories without the limitation of a single monolithic memory.

Therefore one aspect of this invention is a) to use a plurality of preferably serial data transmission channels, b) each may operate on a different address and/or be driven by a different processor core or unit within a processor core (e.g. different caches, LCM, TCM, etc); c) at least a subset of the plurality of channels are capable of connecting to the same higher level memory system and/or device. In one mode the subset of channels may operate completely independent driven by different cores and/or units with a core and/or operate on different addresses, in another mode they might be bundled for increasing the data transmission bandwidth operating on the same address and driven by the same core or unit within a core.

One major benefit of this invention is the unimpaired operation and transfer of the serial memory channels. Address sequences can be completely independent. The memory banks can independently precharge, particularly in respect of time. Caches and cache hierarchies may be independent, so that there is no collision between the address spaces of a plurality of processor cores and/or software threads.

Ideally there are at least as many (serial) memory channels as cores implemented. If the cores or at least some of the cores support multiple address generators (AGU) and/or Load/Store Units (LSU), preferably more (serial) memory channels than processor cores exist, preferably at least one channel for each respective unit (AGU and/or LSU). For even greater performance, at least for some of the respective units (AGU and/or LSU) more than one memory channel is available.

Figure 1:
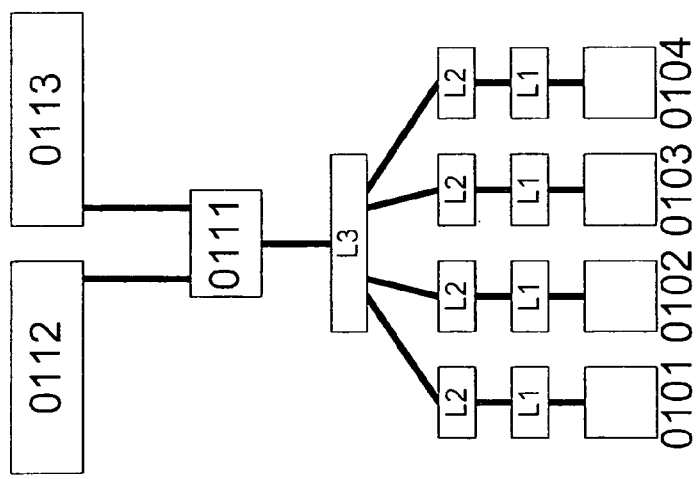
FIG. 1 is a diagrammatic illustration of a multi-core processor memory architecture of the prior art.

FIG. 1 shows a multi-core processor memory architecture of the prior art having 4 processor cores (0101, 0102, 0103, 0104). Each core may have its dedicated Level-1 Cache (L1) and possibly Level-2 Cache L2. According to [2] each of the level may comprise local direct access memory (TCM and/or LCM). The cores memory paths are combined into a single Level-3 Cache (L3). A memory controller (0111) connects the L3 cache to the main memory. Exemplary shown are 2 memory banks, 0112 and 0113). The memory banks may operate ganged or unganged. Examples for such architectures are the Intel Core2Duo, i5, i7 or the newer Sandybridge Architecture, in which the lower level caches may be shared and/or accessed by the cores via a ring-bus.

FIG. 2 shows a respective example for an architecture according to this invention. The fundamental architecture is the same, the 4 cores are embodied (0101, 0102, 0103, 0104), each core may have its dedicated Level-1 Cache (L1) and possibly Level-2 Cache L2, each of the level may comprise local direct access memory (TCM and/or LCM). It shall explicitly be noted, that in a preferred embodiment, the Level-1 (L1) and Level-2 (L2) memory hierarchy might be implemented according to [2]. The memory channels are not combined into a single L3 cache, but switched by a switch (0201), so that depending on the respective address a matching memory bank is selected. The switch (0201) could exemplary be implemented as a crossbar, or if in one embodiment the channels are already serialized at this point, using switches similar to the well know LAN or ATM network switches. Important is, that the channels from the caches are not merged (funneled) into a single channel or very limited amount of channels (3 or less) to the memory banks (0207, 0208, 0209, 0210, but are preferably kept completely separated (or only minimally combined (e.g. a 1:2 or 1:4 ratio for large multi-core systems (e.g. >8 cores)).

The switch, however, not only connects the channels via independent and/or dedicated memory controllers (0203, 0204, 0205, 0206) to the memory banks, but also arbitrates the access, in case a plurality of channels requests access to the same memory bank.

Each channel has its own and independent memory controller (0203, 0204, 0205, 0206), interfacing to the independent system memory banks (0207, 0208, 0209, 0210).

In one embodiment a joint L3 cache (0202) might be attached to the switch, in which e.g. jointly accessed data may reside, which is shared or exchanged between the cores. Other jointly used data may reside in a LCM according to [2]. The L3 cache (0202) might be monolithic or also split into a plurality of banks, so that each of the banks can be accessed in parallel without significantly impairing other accesses.

Preferably cores comprise a plurality of independent address generators and/or Load/Store Units (for example Intel Core2Duo, i7, Sandybridge, in which at least one store and one load operation can be independently performed, for more complex architectures see also [1] and [2]).

Figure 3:
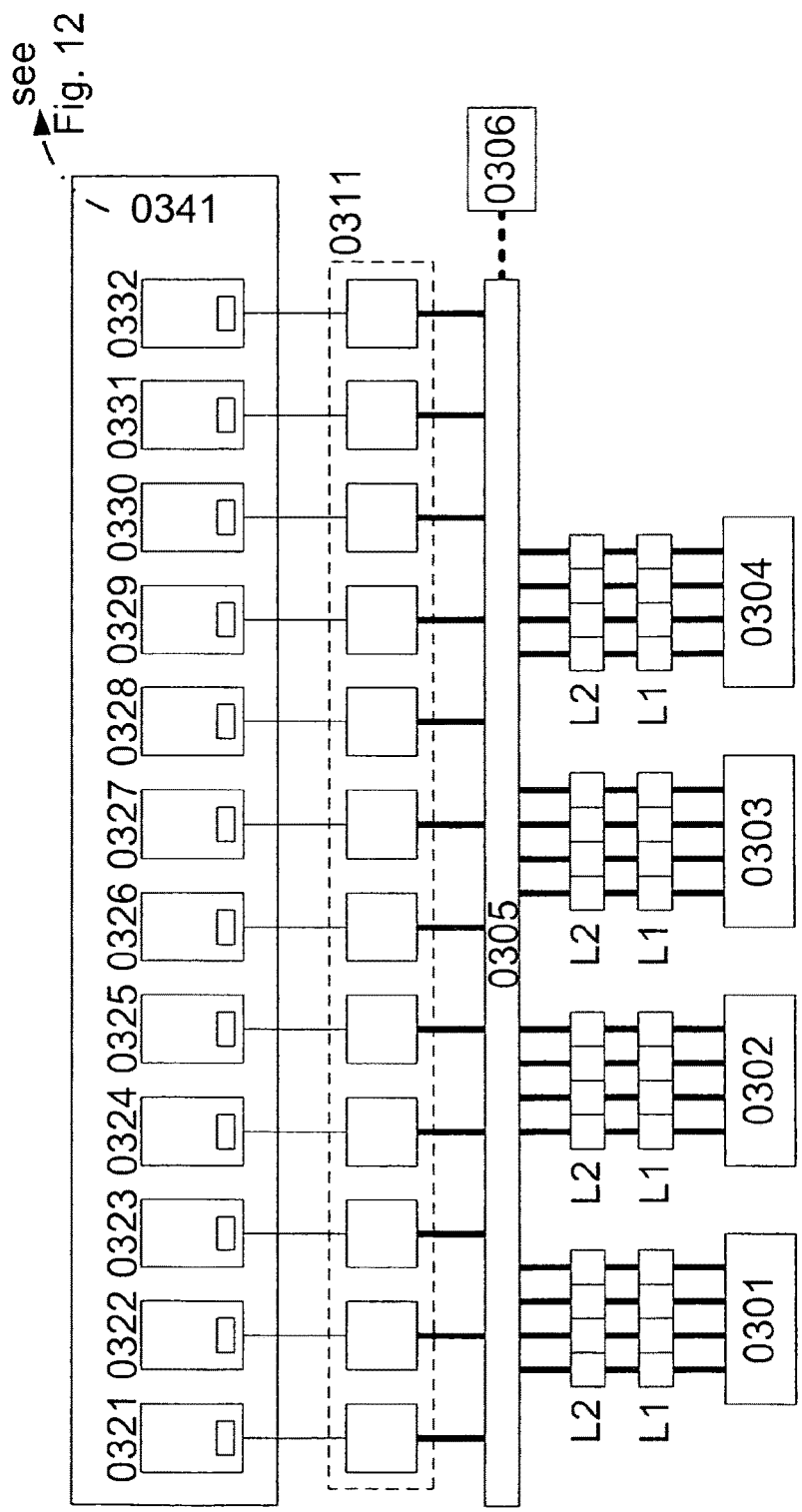
FIG. 3 is a diagrammatic illustration of another example multi-core processor memory architecture of the present disclosure.

Exemplary a respective implementation is shown in FIG. 3. Again 4 cores are implemented (0301, 0302, 0303, 0304), having a L1 and L2 memory hierarchy similar to FIG. 2. Each core has 4 independent channels, connected to 4 independent address generators and/or Load/Store Units. It shall be noted, that the channels are not necessarily as homogeneous as shown in FIG. 3 but not need to have an identical architecture: For example, some may have L1 and L2 caches, others may only have a L1 cache, others may comprise a TCM and/or LCM according to [2].

The exemplary 16 channels (4 channels per core, 4 cores in total), are connected to a switch (0305), which may be implemented as described in FIG. 2 (0201).

In this exemplary embodiment fewer memory banks the memory channels exist. Therefore the switch arbitrates and multiplexes the access of the n channels onto m memory banks (0321, 0322, 0323, 0324, 0325, 0326, 0327, 0328, 0329, 0330, 0331, 0332).

The memory banks are preferably located within a unit (0314) such as a memory chip or a memory module, e.g. a SIMM or DIMM. A respective exemplary implementation is shown in FIG. 12, with e.g. 1221 corresponding to 0321, 1222 to 0322, 1223 to 0323, and so on.

Figure 3A:
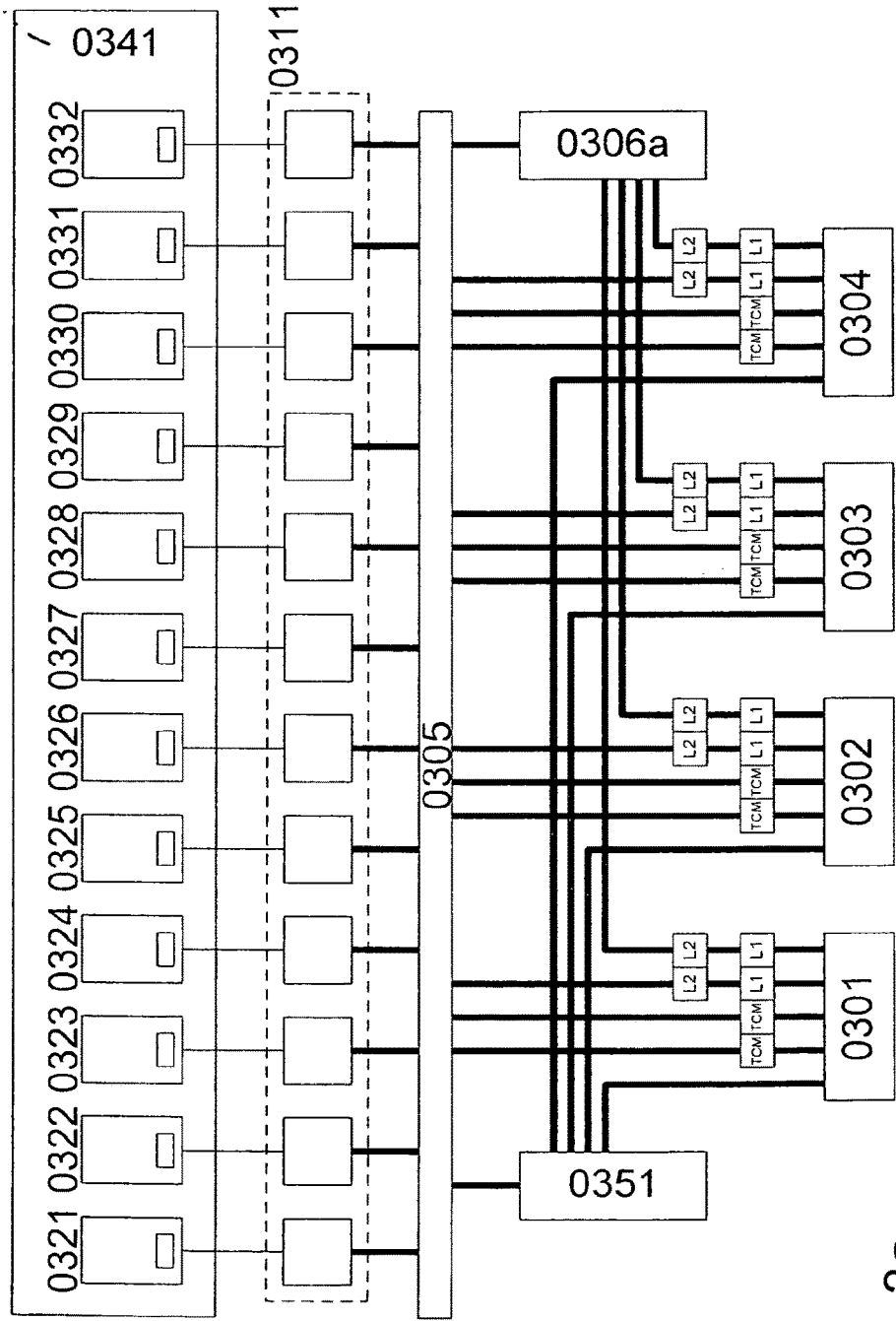
FIG. 3a is a diagrammatic illustration of another example multi-core processor memory architecture of the present disclosure.

The embodiment in FIG. 12 comprises 8 memory banks, while FIG. 3 and FIG. 3a show 12 banks. However it is obvious for one skilled in the art, that memories with more than 8 banks can be implemented according to this invention and are even preferred. In 8 processor-core systems memories with 32 banks seem preferable, assuming that each core comprises 4 independent load/store units. More or less load/store units will change the preferred ratio, as well as a higher or lower number of processor-cores in the system.

As described in FIG. 2 (0202) a L3 cache may be attached to the switch (0306).

It shall be expressively noted, that in some embodiments the switch (0201, or 0306) may not be located between the cores and the memory controllers (as shown), but between the memory controllers and the memory banks. Particularly in those implementations serial switches similar to LAN and/or ATM network switches may be implemented. However, both the memories and the memory controller, particularly the protocol in between, must be adapted, so that a random plurality of memory controllers may communicate with a random plurality of memory banks.

Yet another embodiment is shown in FIG. 3a. Embodiments like this exemplary one are preferred as it comprises advanced and more efficient local memory architectures as described in [2], which is entirely incorporated by reference for full disclosure and respective features might be claimed. Each of the processor cores interfaces through 5 channels to the memory banks (0321, 0322, 0323, 0324, 0325, 0326, 0327, 0328, 0329, 0330, 0331, 0332) of the main memory (0341) which might be a chip or module.

The channels are connected in different ways to the switch (0305) and ultimately to the main memory: One of these channels connects to a Locally Connected Memory (LCM, 0351) according to [2], which is in this example shared between all cores. 2 channels per core are connected to Tightly Coupled Memories (TMC) according to [2]. One channel is connected via a Level-1 and Level-2 cache hierarchy. Yet another channel is via a Level-1 and Level-2 cache hierarchy to a shared Level 3 cache (0306a).

In such an embodiment, data might be partitioned into 3 groups:
1. Shared by many cores (SBM)
2. Accessible by many cores but assigned to a preferred owner (processor-core) (ABM)
3. Exclusively dedicated to a single owner (processor-core) (EDO)

Data shared by many cores (SBM) is preferably treated (by the operating system and/or Memory Management Unit) such, that it resides in the shared Level 3 cache and/or the shared LCM (0351).

The sharing the Level-3 cache requires a coherency protocol implemented in the paths from the processor cores through the Level-1 and Level-2 cache to the Level-3 cache. (It shall be noted that in a slightly modified embodiment, the Level-2 cache might be already shared (as e.g. shown in FIG. 1). Sharing data via the LCM (0351) is preferably software managed using dedicated locking and/or scheduling mechanisms. For further details, protocols and mechanism reference is made to the patent [2] incorporated by reference.

Data accessible by many cores but assigned to a preferred owner (processor-core) (ABM), might be transferred via any of the channels. However, in the preferred embodiment, no implicit coherence management is provided by the hardware, but explicit software management is preferred, e.g. using dedicated locking and/or scheduling mechanisms.

Data exclusively dedicated to a single owner (processor-core) (EDO) might be transferred via any of the channels. However, as no coherence management is required, it is preferably transferred via channels not having coherence measures implemented in order to avoid the resulting overhead (e.g. energy consumption, bandwidth reduction, etc).

Memory Architecture

Within an inventive system, a plurality of memory banks exist (e.g. FIG. 3: 0321, 0322, . . . , 0332). The banks may be implemented as dedicated memory chips, which could be combined on one or a plurality of memory modules, similar to DIMMs known in the prior art. Also and preferably all banks or a plurality of banks may be combined into one single memory chip. For example could a memory chip comprise 4 banks. This allows to implement the memory system of FIG. 3 into 3 chips, a first one comprising 0321, 0322, 0323, 0324, a second one comprising 0325, 0326, 0327, 0328 and a third one comprising 0329, 0330, 0331, 0332. Those chips may be mounted onto a single memory module. In other embodiments, a memory module may comprise 2 chips, so that 2 memory modules are required for the memory system in FIG. 3, with one chip unused. In yet another embodiment, a memory module may comprise 4 chips, so that only one module (with one chip unused) is required for the exemplary system of FIG. 3.

However, it is clearly preferred to achieve the highest possible integration density. Therefore, if possible memory chips comprise the plurality of independently operable banks. If this is not possible, e.g. due to complexity or cost, a plurality of memories are implemented on a single module such that they form a plurality of independently operable banks.

"Independently operable" means that each bank or at least some of the plurality of the banks can be simultaneously accessed by different channels; and read and write data, precharge, etc. independently from other banks.

Multiple memories may be combined to form a larger memory space, for example by forwarding the serial channels from one module to the next. Respective technologies are known in the prior art, e.g. Rambus XDR [7] and FBDIMMs [6].

FIG. 4 shows an exemplary embodiment of a memory. 4 banks (0401, 0402, 0403, 0404) are implemented. The banks may operate independent, e.g. be separately access, addressed, precharged, etc. As each bank usually has a close relation to a single or very small amount of address generators and/or Load/Store Units, in some embodiments each bank may comprise its dedicated small cache or data buffer (0405, 0406, 0407, 0408). Each bank may be reserved for or at least preferably accessed at runtime by a single processor core (in a multicore environment) or a group of closely cooperating processor cores, sharing the data located in the memory bank. In an optimal environment banks might even be dedicated (at least temporarily) to a cache and/or load/store unit (e.g. an address generator) within a processor core.

If a bank is reserved for a processor core, this core has unrestricted access to the bank. No other core is allowed accessing the data unless the core it is reserved for explicitly grants access. This can be done by a hardware mechanism or preferably the application program executed or the operating system.

As a result of this, bandwidth is greatly increased as only the core the bank is reserved for has unlimited access. Simultaneously coherency issues are greatly reduced as the data in the memory bank is by definition reserved for that single core. If other cores request access, the request and approval is handled explicitly allowing for explicit and controlled (e.g. by the application program or operating system) sharing of data, so that coherency is software managed.

This leads to high data locality and dedication, reducing the likelihood of accesses to a specific memory bank by other processor cores or units within a processor core. This dedication to a core or unit allows for undisturbed data access enabling data transmission at high bandwidth and low latency.

The close relationship between the memory banks and the software accessing the data (via said address generators and/or Load/Store units) leads to decent locality of the access patterns to efficiently enable the implementation of a cache closely coupled to the memory bank. Also or alternatively each bank may have the means for independent and/or dedicated precharge and possible some buffers (if no cache is implemented).

4 independent serial interfaces (0409, 0410, 0411, 0412) may independently transfer data via a serial channel (0413, 0414, 0415, 0416) to the accessing core.

In a preferred embodiment, multiple channels can be dynamically combined to achieve higher bandwidth, even transmitting from a single block. For example this can be achieved by implementing multiplexer/demultiplexer stages (0421, 0422, 0423, 0424) between the serial interfaces and the memory banks and/or cache.

If for example a memory bank (or its cache) provides a 64 bit interface to the serial interface, a multiplexer could sequentially select in 4 steps 16 bits (Step 1: bits 0 . . . 15, Step 2: bits 16 . . . 31, step 3: bits 32 . . . 47, step 4: bits 48 . . . 63) for transmission via the serial interface. When 2 interfaces are combined only two sequential steps are necessary: In the first step, the first multiplexer of the first serial interface selects bits 0 . . . 15 and the second multiplexer of the second interface selects bits 16 . . . 31; in the second step the first multiplexer of the first serial interface selects bits 32 . . . 47 and the second multiplexer of the second interface selects bits 48 . . . 63.

When (temporarily) even all 4 channels are combined for transmitting data, only one single step is required: The first multiplexer of the first serial interface selects bits 0 . . . 15 and the second multiplexer of the second interface selects bits 16 . . . 31, third multiplexer of the third serial interface selects bits 32 . . . 47 and the fourth multiplexer of the fourth interface selects bits 48 . . . 63.

The exemplary shown memory in FIG. 4 comprises only 4 memory banks, which may be insufficient. Ideally the banks are rather fine grained, so that each memory provides 1024 banks or even more to provide reasonable flexibility.

In a preferred embodiment the banks are have no strict relationship to a specific interface, but each interface can access the banks freely. This can be achieved via a switch connecting temporarily a bank to a channel depending on the address transmitted by the channel. The switch might be similar to the one on the processor side (e.g. 0201, 0305) as previously discussed. If a plurality of channels addresses the same bank, one channel is arbitrated first for data transfer, afterwards the next channel is arbitrated, and so on. In cheaper memory implementations, all or at least some bank to interface relations may be limited to one exclusive connection at a time. This minimizes the hardware complexity of the switch but simultaneously reduced the number of parallel transfers between the interfaces and the memory banks.

In a preferred embodiment memory banks might be locked to specific interfaces. If other interfaces (which means other processor cores) require access, the core currently owning the bank has to unlock the bank first. This allows for implementing data coherence and/or locking mechanisms for shared data, as well as efficient memory protection.

One particular advantage of the inventive architecture is the predictability of the memory access patterns. In architectures of the prior art, a plurality of threads share the memory, the access patterns depend on the currently active thread and the currently arbitrated core. This prohibits any kind of intelligent forward looking mechanism locally associated with the memory blocks for speeding up the memory access. However, given the increased locality and virtual close and direct connection of a memory block to the respective AGU and/or LSU in the core, prechargeing and/or precaching and/or preaddressing features might be implemented in the memory blocks for reducing the over-all access time.

Based on temporal or spatial locality of data, future data accesses can be predetermined and executed in advance, providing faster access.

A variety of methods can be implemented, either exclusively or (as preferred) in combination. For example:
1. The memory banks could speculatively precharge and/or precache a next data block. For example a local pattern generator in the memory may select the sequentially next block or a next block according to a previously analysed access pattern (e.g. by analysing past address patterns).
2. A local pattern generator in the memory may receive during an initialization or setup sequence an address pattern, either as a list of addresses or a formula how to calculate the addresses and then selects at access time the next block to preload (e.g. precharge and/or precache) on basis of the current addresses.
3. A local pattern generator in the memory may receive with each data transfer (ideally block transfers) a directive which block has to be preloaded (e.g. precharged and/or precached) next.

The memory architecture according to [5] or the known XDR memory architecture of Rambus may constitute a potential foundation for implementing memories according to this invention.

FIG. 11 shows an exemplary DRAM of the prior art. The addresses (1101) are fed to a command decoder (1102), which also receives the control signals, such as RAS, CAS, etc. The command decoder feed the controller (1103) generating the internal control signals and timing (e.g. read, write, refresh, precharge, etc). The addresses are also fed to the row buffer (1104) buffering the row address and column buffer (1105) buffering the column address. The row decoder (1106) and column decoder (1107) respectively decode the addresses from the buffers and drive the memory banks. Sense amplifiers (1107) acquire the read signals from each related memory bank. In this example 8 memory banks are implemented (1108a, ..., 1108d, ..., 1180h), which are selected by the control logic. Data control logic (1109) selects the data word to be read or written and masks unmodified bits. A latch arrangement (1110) stores the respective read or write data.

Another exemplary embodiment of a memory chip according to the present invention is shown in FIG. 12. This implementation comprises 6 IO channels (CAN0-5, which might be completely serial, partially serial or even parallel). Each channel has a respective controller for managing the channel interface (1201, ..., 1206). Each channel drives an internal bus system, which might be fully parallel (address, data, and control each have separate lines), multiplexed (e.g. first and second address part are multiplexed, data and control are multiplexed and transmitted in 2 cycles; address, data and control are all multiplex and transmitted in 3 cycles; or other combinations), or serial.

Parallel busses are fast and don't require much logic at the side of the memory banks for further management. However they are big, making the later on described connector structures (1211, ... 1218) large and inefficient.

Serial busses are small, theoretically leading to small crossbar structures, but requiring significant amount of additional management structures at each of the memory banks and within the crossbar structures.

Multiplexed busses are a compromise and regarded as the preferred embodiment.

However, ultimately the chosen implementation is purely a design choice, depending on specific requirements for e.g. performance, power dissipation and area; also the specification of e.g. the memory size, number of banks, number of channels, protocol complexity; further more, the silicon technology and abilities of the process and certainly other factors.

This exemplary embodiment comprises 8 memory banks (1221, ..., 1228). The memory banks are connected via a flexible and runtime controllable connector structures (1211, ..., 1218) to the channel interfaces (1201, ..., 1206). The connector structure is under control of the channel interfaces and connects the memory banks flexibly to the channels are request by the addresses provided by each of the channels. For each address, the actual connection setting between channel and memory bank may change as required by the current address. Each connector structure may comprise multiplexer structures, crossbar structures or any suitable means for providing the runtime configurable connectivity.

In some embodiments memory banks might be connected via one bus to exactly one channel. In other embodiments a plurality of channels may access a memory bank simultaneously, so that a plurality of connections to a plurality of channels is provided. In the shown exemplary embodiment, each bank provides 4 connections ($B_0$, $B_1$, $B_2$, $B_3$) and has therefore the capability to connect simultaneously to up to 4 channels. For example 2, 3, or all 4 channels might be combined to transfer a plurality of data words in parallel to a single processor core and/or to a single load/store unit and/or a single cache and thus increasing the available bandwidth by a respective factor.

Each exemplary memory bank comprises a memory array (1241), sense amplifiers (1246), row decoder (1242) and column decoder (1243), as well as the respective row address buffer (1244) and column address buffer (1245). A data control unit (1247) selects the addressed data word for read access and masks unselected parts for write access. Depending on the internal bus type a latch and/or register might be implemented for buffering the data and a bus controller managing the internal bus (1248).

The exemplary embodiment in FIG. 12 has the capability of merging cannel so that a bundle of channels can transfer data jointly between a memory bank and a processor core and/or load/store unit and/or cache. In a preferred embodiment subsequent data words are transferred by the merged channels. The first channel is master controlling the data transfer and transmitting addresses and control. For example in a merged setup using 2 channels, channel 1 ($CAN_1$) might be master and transferring words of the odd address (word aligned) and channel 3 ($CAN_3$) might transfer words of the even address. As another example, a setup using 4 channels might use channel 5 ($CAN_5$) as master, transferring the data word at address $A_{1...0}$=00; and channels 1, 2, and 4 ($CAN_1$, $CAN_2$, $CAN_4$) as depending channels, e.g. with $CAN_1$ transferring words of address $A_{1...0}$=01, $CAN_2$ transferring words of address $A_{1...0}$=10, $CAN_4$ transferring words of address $A_{1...0}$=11. In yet another 4 channel setup channels $CAN_0$, $CAN_1$, $CAN_2$, and $CAN_3$ might be linearly merged.

Which channels are connected to a memory bank is configured by the connector structure as well as the alignment. Each channel being a transfer master can request access to a memory bank by an arbiter (1261) in each of the connector structures. The master channel indicates together with the request for access the slave channels and their alignment to the arbiter. Once the arbiter grants permission it respectively drives (1262) the connector (1263), which e.g. might be a switch, multiplexer and/or crossbar.

Referring back to the memory banks of the exemplary embodiment of FIG. 12, each bank receives the number (1250) of merged channels from the respective arbiter (and/or the first interface bus). The data control unit provides basically access to 4 words simultaneously. A merge control unit (1249) selects the respective part and amount of the data provided by the data control unit (1247), e.g. using multiplexers. Each bank receives the address (1251) from the respective arbiter (and/or the first interface bus $B_0$).

An exemplary channel interface comprises a bus controller (1271), which might comprise a serializer/deserializer if serial channels according to the preferred embodiment are implemented. The bus controller generates the internal bus signals, e.g. data (1272), address (1273), bank select (1274) selecting the respective memory bank (and accordingly arbiter of the connector structure) for access, and control (1275) controlling the access and internal data transfer, including the arbiters. The channel interface comprises a command decoder (1276), decoding the commands from the microprocessor core (e.g. a cache or load/store unit) transmitted by the channel. The decoder transmits the command to a control logic (1277) which generates the respective control signals (1275). A bank decoder (1278) generates the bank select signals (1274) by decoding the respective part of the address (1273). In a preferred embodiment, the memory chip comprises a specification memory (1281), in which the specification of the memory chip is stored, e.g. indicating the number of banks, capabilities of merging channels, banks size, etc. This specification memory is readable by the attached processor and/or processor core. Its information can be used by the Memory Management Unit and/or the Operating System to setup the memory layout such that the physical memory range of each processor core (and/or the caches, and/or TCMs, and/or LCMs, and/or load/store units) are aligned to the memory banks of the chip. This information enables, the Memory Management Unit of the processor and/or each of the processor cores, or the Operating System to define the physical memory layout in a way that allows for maximum independency between the memory banks, so that ideally each bank is dedicated to a single processor core and/or cache and/or load/store unit. For ideal independence, particularly memory banks can be dedicated to specific processes and/or tasks and/or threads, to allow for parallel access to the memory banks. Simultaneously the dedication of complete memory banks to specific processes and/or tasks and/or threads minimized coherence issues and allows for reduced coherence management by both, hardware (e.g. coherence protocols) and software (e.g. locking).

Effect on the Processor Architecture

Crossbar

In the preferred embodiment one major change of the processor architecture is the implementation of a crossbar capable of flexibly interconnecting the external memory channels with the internal AGU and/or LSU.

In one embodiment, the switch decodes for each access either on a word or block oriented basis the memory address and accordingly sets the connection. However, this increases not only the switch's complexity and latency but simultaneously its power dissipation. Therefore, in the most preferred embodiment, the switch is controlled by the Memory Management Units, setting the interconnection of the switch in accordance with the currently used memory pages of the data transfers.

As previously described the switch may be embodied in a vast variety of implementations, e.g. multiplexers, crossbar switches, serial/parallel network switches or optical switches.

Memory Management Unit (MMU)

Each core may comprise a local MMU.

In some embodiments, a global MMU might be implemented instead. One global MMU might be more efficient to manage by the operating system, than a plurality of local MMUs per core. Virtual memory addresses are used in the memory hierarchy up to the global MMU.

As one single global MMU might be overloaded with the data traffic generated by the plurality of processor cores, in a preferred embodiment, each processor has its local MMU, which is under control of one global MMU or MMU interface to reduce the burden of the Operating System managing each processor cores MMU separately.

In a preferred embodiment, a unique channel identification is available for each of the memory channels.

In one embodiment the physical addresses are extended such that the unique identification is part of the physical address, e.g. the upper most part of the address. This address part defines the memory channel which is used for the transfer.

In a preferred implementation, the MMU operates on the physical granularity of memory banks and accordingly manages the physical addresses. Each memory bank has a unique identifier, which may be translated to the channel identifier. The translation might be done within a separate Channel Management Unit, yet in the most preferred embodiment it is implemented as part of the MMU.

Bypassing MMU and/or Crossbar

In some embodiments some channels may bypass the MMU and/or crossbar, for reducing latency and saving energy. In some embodiments, with reference to [2] the TCM and or LCM paths may use such bypasses for increasing their efficiency. In most cases, at least the TCM contain solely local data, which other cores do not access. Therefore it is possible and efficient to bypass all parts of the memory hierarchy increasing latency and wasting power.

As bypassing the MMU may rise major issues managing virtual and physical addresses in the memory space, it is preferred that at least a minimal address translation is performed, for example as described in [2] FIGS. 10, 11, and 12.

Memory Technologies

It shall be expressively noted, that the inventions laid out in this patent are neither limited to SRAM nor to DRAM technology. A man skilled in the art understands that the invention can be applied on other memory technology, such as SRAM, Flash or new upcoming technologies (e.g. TRAM, TTRAM, Z_RAM, FRAM, Magnetoresistive RAM, PMC, Racetrack, SONGS, NRAM, and other technologies). Some of those memory technologies are briefly described in [2], which is fully incorporated by reference.

The present invention is independent of the memory technology. It is drawn to more efficient data transfer and access and therefore basically applicable on all existing and future technologies.

LITERATURE AND PATENTS OR PATENT APPLICATIONS INCORPORATED BY REFERENCE

The following references are fully incorporated by reference into the patent for complete disclosure. It is expressively noted, that claims may comprise elements of any reference embodied into the specification:
[1] ZZYX07: PCT/EP 2009/007415 (WO2010/043401); Vorbach
[2] ZZYX08: PCT/EP 2010/003459 (WO2010/142432); Vorbach
[3] ZZYX09: PCT/EP 2010/007950; Vorbach
[4] ZZYX10: PCT/EP 2011/003428; Vorbach
[5] US2006/0117155; Ware et al.
[6] Technical Note FBDIMM—Channel Utilization (Bandwidth and Power); PDF: 09005aef8251c075 Micron Technology, Inc., tn4721.fm—Rev. B 1/10 EN
[7] RAMBUS XDR Architecture; DL-0161 Advance Information, Version 0.8
[8] The unabridged Pentium 4; IA32 Processor Genealogy; Tom Shanley; Mindshare Inc.; ISBN0-321-25656-X
[9] CMOS VLSI Design; Fourth Edition; A circuits and systems perspecive; Neil H. E. Weste and David Money Harris; Addison-Wesley; ISBN-13:978-0-321-54774-3
[10] Minimizing Test power in SRAM through Reduction of Precharge Activity; Luigi Dilillo, Paul Rosinger, Bashir M. AlHashimi of University of Southampton and Patrick Girard of Laboratoire d'informatique, de Robotique et de Microélectronique de Montpellier
[11] ARM926EJ-S™ Revision: r0p5 Technical Reference Manual; DI0198E_arm926ejs_r0p5_trm.pdf; ARM Ltd.
[12] http://www.videolan.org/developers/x264.html: VideoLAN, VLC media player and x264 are trademarks registered (or in registration process) by the VideoLAN non-profit organization. Software are licensed under the GNU General License.
[13] White Paper "Inside Intel® Core™ Microarchitecture Setting New Standards for Energy-Efficient Performance"; Ofri Wechsler Intel Fellow, Mobility Group Director, Mobility Microprocessor Architecture Intel Corporation; Copyright© 2006 Intel Corporation. Printed in the United States. 0306/RMR/HBD/2K 311830-001US
[nn] Pentium PRO and Pentium II System Architecture; Second Edition; Tom Shanley; Mindshare Inc.; ISBN978-0-201-30973-7

The invention claimed is:

1. A multi-core processor memory system, comprising:
a main memory including a plurality of memory blocks;
a plurality of memory controllers coupled to the plurality of memory blocks;
a plurality of memory channels provided between a multi-core general-purpose processor and the main memory, the multi-core processor including a plurality of processor cores;
the plurality of memory channels comprising at least as many memory channels as processor cores,
each memory channel being associated with one of the processor cores,
the plurality of memory channels operative to selectively connect each of the plurality of processor cores to each of the plurality of memory blocks, and
the multi-core processor memory system configured to dynamically relate at run-time one or more of the memory blocks dedicatedly to an accessing processor core of the plurality of processor cores,
the accessing processor core having dedicated access to the one or more memory blocks via the associated memory channel of the accessing processor core; and
at least one switch provided between the plurality of processor cores and the plurality of memory controllers, the at least one switch operative to perform the selective connection of each of the plurality of processor cores to each of the plurality of memory blocks.

2. The system according to claim 1, wherein the memory channels transmit serial data.

3. The system according to claim 1, wherein at least one of the memory channels is temporarily exclusive for transmitting data solely between one of the memory blocks and one of the processor cores.

4. The system according to claim 1, wherein data is transmitted between multiple of the processor cores and multiple of the memory blocks in parallel.

5. The system according to claim 4, wherein each of the transmissions of data is independent of the other transmissions of data between the multiple processor cores and the multiple memory blocks.

6. The system according to claim 4, wherein the transmissions of data do not impair the other transmissions of data between the multiple processor cores and the multiple memory blocks.

7. The system according to claim 1, wherein each of the plurality of memory channels is connected to an associated dedicated memory controller of the plurality of memory controllers.

8. The system according to claim 1, further comprising at least one level-1 cache provided between at least one of the plurality of processor cores and the at least one switch.

9. The system according to claim 8, further comprising at least one level-2 cache provided between at least one of the plurality of processor cores and the at least one switch.

10. The system according to claim 1, wherein the plurality of memory channels includes:
a plurality of first connections between the plurality of processor cores and the at least one switch; and
a plurality of second connections between the at least one switch and the plurality of memory blocks.

11. The system of claim 10 wherein the plurality of first connections are at least as numerous as the plurality of second connections.

12. The system of claim 10 wherein the plurality of second connections are at least as numerous as the plurality of processor cores.

13. The system according to claim 10, wherein each of the plurality of second connections corresponds to a different one of the plurality of first connections.

14. The system according to claim 1, wherein for at least one processor core of the plurality of processor cores, a particular processor core is connected to multiple memory channels of the plurality of memory channels, wherein the multiple memory channels connect the particular processor core to the at least one switch.

15. The system according to claim 1, wherein the plurality of memory channels include a separate connection to each the plurality of memory blocks, wherein a number of the separate connections is at least a number of the plurality of processor cores.

16. The system according to claim 1, wherein each of the processor cores comprises a plurality of load/store units, each load/store unit configured to supply information to one memory channel of the plurality of memory channels.

17. The system according to claim 1, wherein each of the plurality of memory controllers is directly connected to an associated memory block of the plurality of memory blocks.

18. The system according to claim 1, wherein the plurality of memory channels are arranged in parallel and configured to communicate data to and from the plurality of memory blocks in parallel.

19. The system according to claim 18, wherein the plurality of memory channels are configurably connectable to the plurality of memory blocks to configure which of the plurality of memory channels are connected to respective memory blocks of the plurality of memory blocks.

* * * * *